United States Patent
Saegusa et al.

(10) Patent No.: US 7,535,711 B2
(45) Date of Patent: May 19, 2009

(54) WIND VELOCITY MEASURING DEVICE AND ELECTRONIC APPARATUS

(75) Inventors: Takashi Saegusa, Matsumoto (JP); Tsuyoshi Arai, Ina (JP); Hideki Takasuka, Matsumoto (JP); Masaki Uchida, Matsumoto (JP); Yohei Sakai, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 31 days.

(21) Appl. No.: 11/803,347

(22) Filed: May 14, 2007

(65) Prior Publication Data

US 2007/0261824 A1 Nov. 15, 2007

(30) Foreign Application Priority Data

May 15, 2006 (JP) ............................. 2006-135095

(51) Int. Cl.
*H05K 7/20* (2006.01)
*G03B 21/16* (2006.01)

(52) U.S. Cl. .................... 361/695; 361/690; 353/52; 353/57; 353/58

(58) Field of Classification Search ............... None
See application file for complete search history.

(56) References Cited

U.S. PATENT DOCUMENTS

| | | | | |
|---|---|---|---|---|
| 6,111,630 A | * | 8/2000 | Watanuki et al. | 349/161 |
| 6,132,049 A | * | 10/2000 | Yamaguchi et al. | 353/61 |
| 6,157,897 A | * | 12/2000 | Yoshikawa | 702/132 |
| 6,481,854 B1 | * | 11/2002 | Sugawara et al. | 353/52 |
| 6,532,151 B2 | * | 3/2003 | Osecky et al. | 361/687 |
| 6,558,003 B2 | * | 5/2003 | Mihara | 353/52 |
| 6,736,513 B2 | * | 5/2004 | Koyama et al. | 353/31 |
| 6,857,749 B2 | * | 2/2005 | Fuse et al. | 353/57 |
| 6,935,750 B2 | * | 8/2005 | Shiraishi et al. | 353/57 |
| 6,986,582 B2 | * | 1/2006 | Kobayashi | 353/61 |
| 7,252,416 B2 | * | 8/2007 | Katayama et al. | 362/373 |
| 2005/0117077 A1 | * | 6/2005 | Utsunomiya | 349/5 |

FOREIGN PATENT DOCUMENTS

| | | | |
|---|---|---|---|
| JP | 04-060534 | | 2/1992 |
| JP | 11019442 A | * | 1/1999 |
| JP | 11-84534 A | | 3/1999 |
| JP | 11-1667718 | | 6/1999 |
| JP | 2005-181412 | | 7/2005 |

* cited by examiner

*Primary Examiner*—Boris L Chervinsky
(74) *Attorney, Agent, or Firm*—AdvantEdge Law Group, LLC

(57) ABSTRACT

A wind velocity measuring device is used in an electronic apparatus including cooled objects and cooling fans for cooling the cooled objects and measures a wind velocity of air blown to the cooled objects. The wind velocity measuring device includes a wind velocity measuring unit that measures a wind velocity of air, and an air circulating unit that circulates a portion of the air blown to the cooled objects. The air circulating unit includes barrier portions that extend to cross a circulation direction of the air at a front stage side of the circulation direction of the air, and an exhaust port that discharges inner air to the outside and is formed at a rear stage side of the circulating direction of the air, and the wind velocity measuring unit measures a wind velocity of the air between the barrier portions and the exhaust port in the air circulating unit.

5 Claims, 12 Drawing Sheets

WIND VELOCITY MEASURING DEVICE AND ELECTRONIC APPARATUS

BACKGROUND

1. Technical Field

The present invention relates to a wind velocity measuring device and an electronic apparatus.

2. Related Art

Generally, various technologies have been known in which a wind velocity of air blown to cooled objects is measured and various controls are performed on the basis of the measured wind velocity, in an electronic apparatus that includes the cooled objects and cooling fans that cool the cooled objects (for example, JP-A-11-84534).

In the technology that is disclosed in JP-A-11-84534, a suction fan blows a cooling air to a panel surface of a liquid crystal panel, and a wind velocity sensor measures a wind velocity of the cooling air that is blown to the panel surface of the liquid crystal panel. In addition, on the basis of the wind velocity measured by the wind velocity sensor, a protection device performs control for making a light source or a power supply turned off or control for making alarm display for an abnormal heat emission performed.

In the technology that is disclosed in JP-A-11-84534, the protection device that includes the wind velocity sensor is provided to be disposed on a top surface of a synthesis prism, that is, a rear stage side of an air passage with respect to the liquid crystal panel that is the cooled object. In addition, the protection device including the wind velocity sensor measures a wind velocity of cooling air that circulates between members of the synthesis prism and the liquid crystal panel and is discharged from the members.

In this structure, when the cooling air circulates between the members of the synthesis prism and the liquid crystal panel, turbulence may be easily generated in the air flow, and a variation may be easily generated in the wind velocity measured by the wind velocity sensor. That is, the wind velocity of the air cannot be measured with high precision, and thus various controls cannot be performed on the basis of the wind velocity.

Further, even when the protection device including the wind velocity sensor is disposed on a front stage side of an air passage with respect to the liquid crystal panel to be the cooled object, it is difficult to measure a wind velocity of air with high precision due to an influence from a pressure of air blown by the cooling fan. Further, various controls cannot be performed on the basis of the wind velocity.

Accordingly, a technology has been required for measuring a wind velocity of air blown to the cooled object with high precision.

SUMMARY

An advantage of some aspects of the invention is that it provides a wind velocity measuring device that is capable of measuring a wind velocity of air blown to cooled objects with high precision, and an electronic apparatus.

According to an aspect of the invention, there is provided a wind velocity measuring device that is used in an electronic apparatus including cooled objects and cooling fans for cooling the cooled objects, and measures a wind velocity of air blown to the cooled objects. The wind velocity measuring device includes a wind velocity measuring unit that measures a wind velocity of air, and an air circulating unit that circulates a portion of the air blown to the cooled objects. The air circulating unit includes barrier portions that extend to cross a circulation direction of the air at a front stage side of the circulation direction of the air, and an exhaust port that discharges inner air to the outside and is formed at a rear stage side of the circulating direction of the air. The wind velocity measuring unit measures a wind velocity of the air between the barrier portions and the exhaust port in the air circulating unit.

In this case, a wind velocity sensor that can measure a wind velocity can be used as the wind velocity measuring unit.

According to this structure, the wind velocity measuring device includes the air circulating unit where the barrier portions and the exhaust port are formed. As a result, the air that propagates toward the air circulating unit collides with the barrier portions, and then flows into a space (hereinafter, referred to as internal space) between the barrier portions and the exhaust port. For this reason, in a state where a pressure of a space (hereinafter, referred to as external space) at the front stage side of the passage of air that flows into the air circulating unit is set to be lower than a pressure of the barrier portion, the air can be flown into the internal space. Further, by using the exhaust port, it is possible to increase a flow rate of the air that circulates in the inner space. Accordingly, the pressure of the inner space becomes a pressure sufficiently lower than the pressure of the external space, and the air can be circulated at a predetermined wind velocity in the inner space. In addition, the wind velocity measuring unit measures a wind velocity of the air in the inner space. In terms of a wind velocity measuring characteristic, the wind velocity measuring unit can measure the wind velocity in an optimal pressure state, and can accurately measure a wind velocity of the air blown to the cooled object without causing a variation in the measured wind velocity value.

According to another aspect of the invention, there is provided an electronic apparatus that includes cooled objects, cooling fans for cooling the cooled objects, and an exterior casing that accommodates the cooled objects and the cooling fans therein, the above-described wind velocity measuring device, a temperature detecting unit that detects an internal temperature of the exterior casing, and a control device that controls driving of constituent members of the electronic apparatus. The exterior casing having formed therein a suction port that introduces an external air to an inside of the exterior casing when the cooling fans are driven, the suction port being constructed so that a filter for preventing a foreign material infiltrating from the outside of the exterior casing freely remove. The control device includes a fan driving control unit that changes a voltage applied to the cooling fans so as to control driving of the cooling fans, on the basis of the temperature detected by the temperature detecting unit, a set wind velocity information storage unit that stores set wind velocity information for a set wind velocity value at which the filter needs to be exchanged, and a clogging detection control unit for clogging detection control that compares a wind velocity value measured by the wind velocity measuring device when the fan driving control unit applies a predetermined voltage to the cooling fan and the set wind velocity value based on the set wind velocity information, and determines whether the filter needs to be exchanged according to the compared result.

In this case, since the electronic apparatus includes the above-described wind velocity measuring device, it is possible to achieve the same advantage and effect as the above-described wind velocity measuring device.

According to this structure, since the control device includes the fan driving control unit, the set wind velocity information storage unit, and the clogging detection control unit, the following filter exchange, that is, the clogging in the filter can be detected.

First, the fan driving control unit changes the voltage applied to the cooling fans (change an air volume of air blown from the cooling fans) so as to control driving of the cooing fans (hereinafter, referred to as fan control), on the basis of an internal temperature in the exterior casing detected by the temperature detecting unit.

In this case, when the usage environment temperature of the electronic apparatus is high, the temperature of the air blown to the cooled object is high, which increases a temperature rising rate in the cooled object (increases an inner temperature rising rate in the exterior casing). Further, when the filter causes clogging, that is, when dusts are attached to the filter and a predetermined amount of air cannot be introduced in the exterior casing, the temperature rising rate in the cooled object is increased. In this case, if the fan driving control unit performs fan control, an increasing rate of a voltage applied to the cooing fans is relatively increased according to the increase in the inner temperature of the exterior casing, and the cooling fans are driven with a set upper limit (upper limit of a usage voltage of the cooling fans).

In addition, the clogging detection control unit determines that the filter exchange is necessary, that is, the filter causes the clogging, according to circumstances, as described below.

That is, when the fan driving control unit applies a predetermined voltage (upper limit) to the cooling fans, the clogging detection control unit recognizes the wind velocity value that is measured by the wind velocity measuring device.

Next, the clogging detection control unit compares the recognized wind velocity value and the set wind velocity value based on the set wind velocity information stored in the set wind velocity information storage unit. As the compared result, when the recognized wind velocity value is smaller than the predetermined set wind velocity value, the clogging detection control unit determines that the filter causes the clogging.

As such, the control device can detect the clogging of the filter on the basis of the wind velocity value measured by the wind velocity measuring device with high precision. Accordingly, for example, after the clogging of the filter is detected, the control device performs control that allows a notifying unit to notify information urging the filter exchange, such that a user properly recognizes the filter exchange. Further, for example, after the filter clogging is detected, the control device performs control that allows predetermined constituent members (a light source, a power supply, or the like) to be turned off (driving stop). Therefore, a life span of the electronic apparatus can be lengthened without the constituent elements of the electronic apparatus being damaged due to the heat.

Preferably, the electronic apparatus according to the aspect of the invention further includes ducts that guide air blown from the cooing fans to the cooled objects, and the wind velocity measuring device is disposed such that the air circulating unit communicates with inner portions of the ducts.

According to this structure, the wind velocity measuring device is disposed such that the air circulating unit communicates with the inner portions of the ducts. That is, the wind velocity measuring device is disposed on the front stage side of the air passage with respect to the cooled objects. In this way, for example, as compared with the structure where the wind velocity measuring device measures the wind velocity of the air having passed through the cooled objects, the measured wind velocity value can be further suppressed from varying, and the wind velocity of the air blown to the cooled objects can be measured with high precision. Further, when the space in the duct (the external space) has a relatively higher internal pressure than the pressure of the air blown from the cooling fan, the pressure of the internal space of the air circulating unit can be sufficiently lowered by the barrier portion. For example, the internal space can be made to have substantially the same pressure as the arrangement locations of the cooled objects, and the wind velocity of the air blown to the cooled objects can be measured with high precision.

Preferably, the electronic apparatus is a projector that includes a light source device, a light modulating device modulating a light beam emitted from the light source device according to image information so as to form an optical image, and a projection optical device that projects the optical image to be enlarged.

According to this structure, the projector is used as the electronic apparatus that can accurately detect the clogging of the filter on the basis of the wind velocity value that has been measured with high precision, as described above. For example, after the filter clogging is detected, the control device performs control that allows predetermined constituent members (a light source, a power supply, or the like) to be turned off (driving stop). As a result, without causing a state where the constituent member, such as the light modulating device, is overheated due to irradiation of the light beam to thus be damaged, the projection image from the projector can be viewed by the user, which does not give the user an unpleasant feeling.

BRIEF DESCRIPTION OF THE DRAWINGS

The invention will be described with reference to the accompanying drawings, where like numbers reference like elements.

DESCRIPTION OF EXEMPLARY EMBODIMENTS

Hereinafter, an embodiment of the invention will be described with reference to the accompanying drawings.

External Structure of Projector

Figure 1:
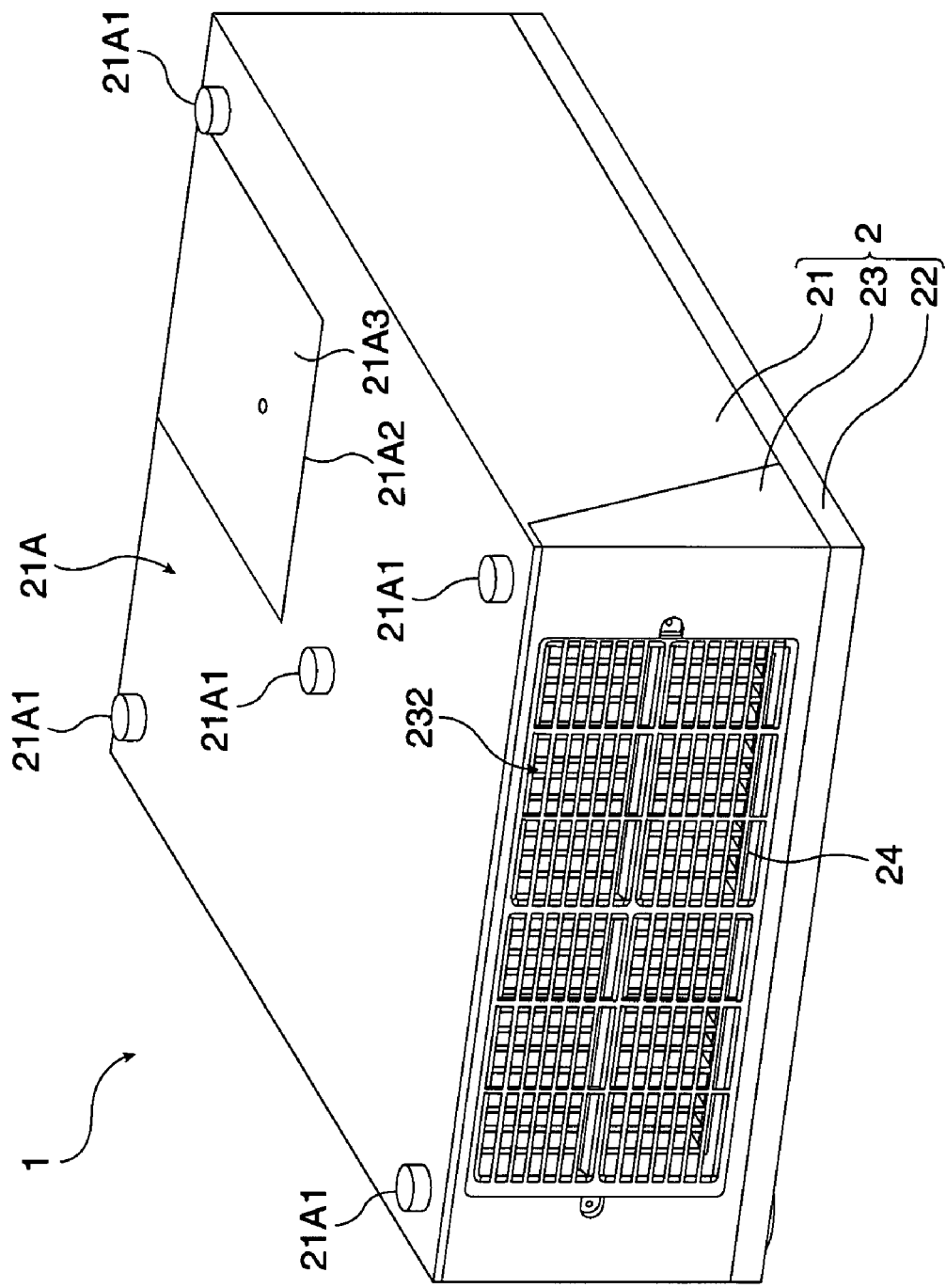
FIG. 1 is a perspective view illustrating an outer shape of a projector as an electronic apparatus according to an embodiment of the invention.

FIG. 1 is a perspective view illustrating an outer shape of a projector 1 that serves as an electronic apparatus according to an embodiment of the invention.

The projector 1 according to the embodiment of the invention modulates a light beam emitted from a light source provided in the projector 1 according to image information so as to form an optical image, and projects the optical image onto a screen or the like so as to be enlarged.

As shown in FIG. 1, the projector 1 includes an exterior casing 2 that is formed in a substantially cubic shape. The exterior casing 2 includes an upper case 21 that forms a top surface and sides of the projector 1, a lower case 22 that forms a bottom surface, and a side case 23 that forms sides in a projection direction of an optical image, which are fixed to one another by means of screws.

Further, a material for forming the exterior casing 2 is not limited to a synthesis resin. However, the exterior casing 2 may be formed of another material, for example, a metal or the like.

Although not shown in the drawing, on the bottom surface of the lower case 22, a plurality of legs that come into contact with an arrangement surface protrude, when the projector 1 is in a regularly disposed posture (the projector 1 is disposed on an arrangement surface of a desk or the like). Further, on a top surface 21A of the upper case 21, a plurality of legs 21A1 (five legs in this embodiment) that come into contact with a ceiling surface protrude, when the projector 1 is in a ceiling-suspended posture (the projector 1 suspends from the ceiling). Further, in the top surface 21A of the upper case 21, an opening 21A2 is formed for exchanging a light source lamp 416 that forms an optical unit 4 to be described below. The opening 21A2 is covered with a covering portion 21A3.

Of the side of the projector 1 in the projection direction of the optical image, the side case 23 forms a side of the exterior casing 2 at the side that is adjacent to a projection lens 3 to be described below. Although not shown in detail in FIG. 1, at substantially a center of the side case 23, a substantially rectangular concave portion 231 (see FIG. 4) is formed in an inward direction, and a transversely long and substantially rectangular opening 232 is formed at the substantial center of the concave portion 231. The opening 232 is a suction port that introduces cooling air from the outside of the exterior casing 2 to the inside thereof by means of a first cooling system 61 of the cooling unit 6 to be described below. Further, a slit 24 for covering the opening 232 is provided in the concave portion 231. Further, the cooling unit 6 will be described in detail below.

Inner Structure of Projector

Figure 2:
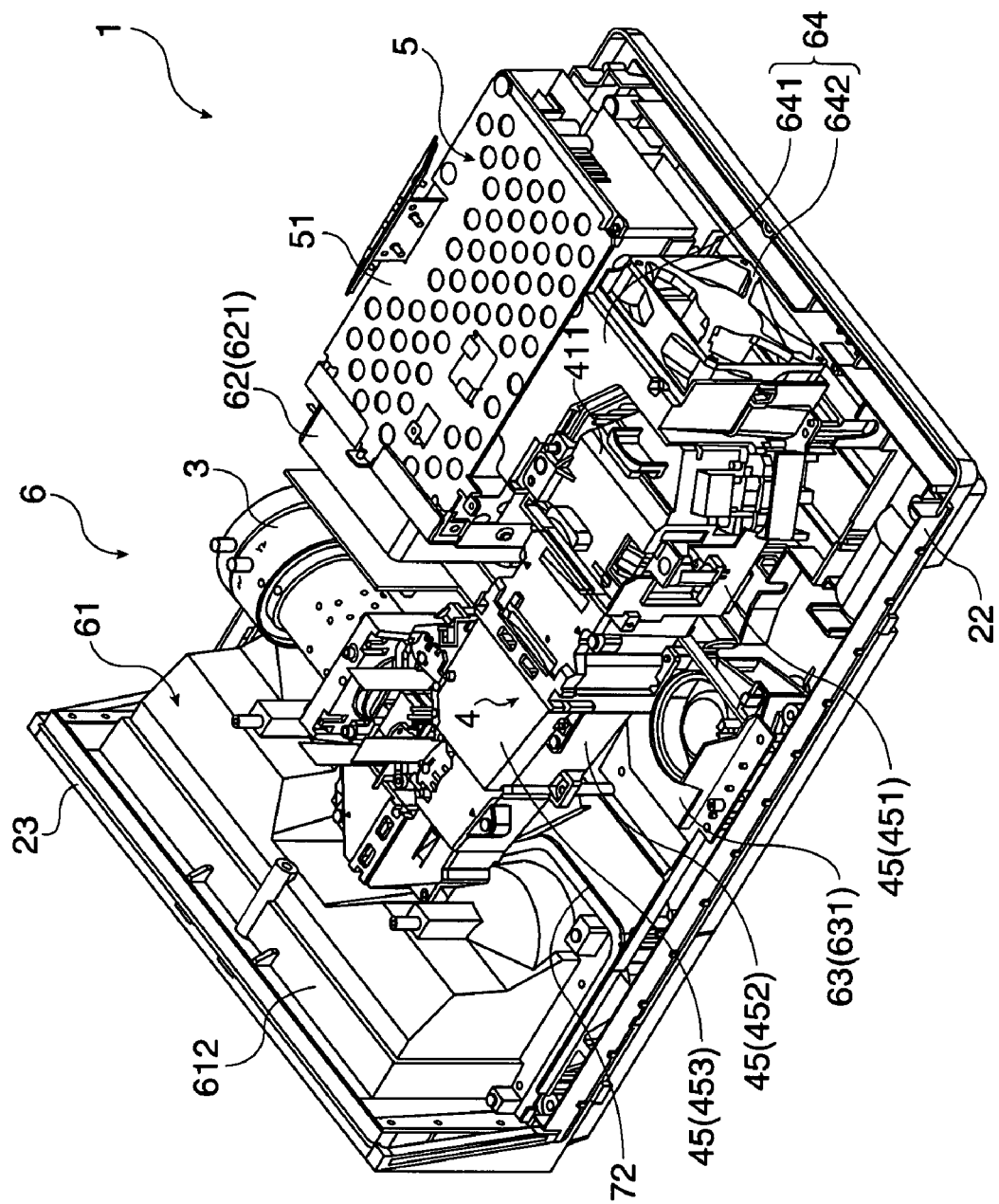
FIG. 2 is a perspective view illustrating an inner structure of a projector according to the embodiment.

FIG. 2 is a perspective view illustrating an inner structure of the projector 1. Specifically, FIG. 2 is a perspective view illustrating the projector 1 in a state where the upper case 21 is separated from the projector 1.

As shown in FIG. 2, in the exterior casing 2, a projection lens 3 that serves as a projection optical device, an optical unit 4 that forms an optical image, a power supply unit 5 that supplies power to individual electronic components constituting the projector 1, a cooling unit 6 that cools optical components and the electronic components emitting heat, a wind velocity measuring device 7 (see FIGS. 6 to 9) that measures a wind velocity of the air blown to the cooled object by means of the cooling unit 6, and a control device 8 (see FIG. 10) that controls the entire projector 1 are disposed.

Among them, the projection lens 3 has a function as a projection optical system that projects an optical image (color image) formed by the optical unit 4 onto a screen (not shown) to be enlarged. The projection lens 3 is constructed as a lens unit in which a plurality of lenses are accommodated in a cylindrical lens barrel, and a projection opening is exposed through an opening (not shown) of the upper case 21.

Structure of Optical Unit

Figure 3:
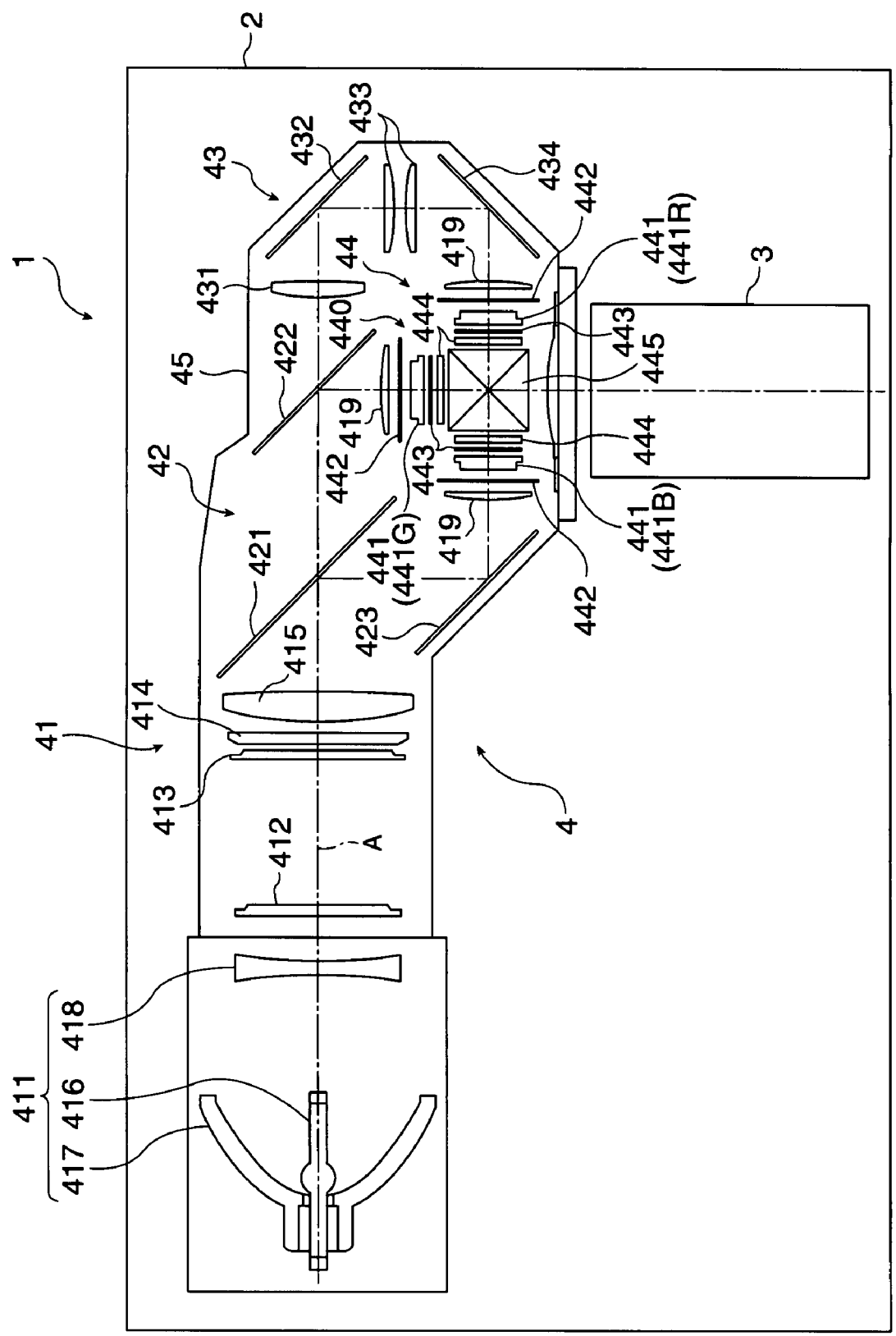
FIG. 3 is a diagram schematically illustrating an optical system of an optical unit according to the embodiment.

FIG. 3 is a diagram schematically illustrating an optical system of an optical unit 4.

Under control of the control unit, the optical unit 4 optically processes a light beam emitted from a light source and forms an optical image (color image) according to image information. As shown in FIG. 2, the optical unit 4 extends along a back surface of the exterior casing 2, and extends along the side of the exterior casing 2 (surface on which the above-described opening 232 is formed). That is, the optical unit 4 has an L shape in plan view.

As shown in FIG. 3, the optical unit 4 includes an illumination optical device 41, a color separation optical device 42, a relay optical device 43, an electro-optical device 44, and an optical component casing 45 that accommodates the optical components 41 to 44 therein.

The illumination optical device 41 is an optical system that uniformly illuminates an image forming region of a liquid crystal panel 441 (to be described below) constituting the electro-optical device 44. The illumination optical device 41 includes a light source device 411, a first lens array 412, a second lens array 413, a polarization converting element 414, and a superimposing lens 415.

The light source device 411 includes a light source lamp 416 that emits radial light beams, a reflector 417 that reflects the radial light beams emitted from the light source lamp 416 and collects the radial light beams at a predetermined location, a collimating concave lens 418 that collimates the light beams collected by the reflector 417 with respect to an illumination optical axis A, and a lamp driver 416A (see FIG. 4) that drives the light source lamp 416 under control of a control device 8. As the light source lamp 416, a halogen lamp, a metal halide lamp, or a high pressure mercury lamp may be used. Further, the reflector 417 may be composed of not only an elliptical surface reflector having a rotational elliptical surface, and may be composed of a paraboloid reflector having a rotational paraboloidal surface. In this case, the collimating concave lens 418 may be omitted.

The first lens array 412 has a structure where small lenses, each having a substantially rectangular outline when viewed from an optical axis direction, are disposed in a matrix. Each small lens spits the light beam emitted from the light source device 411 into a plurality of partial light beams.

The second lens array 413 has the same structure as the first lens array 412, that is, a structure where small lenses are disposed in a matrix. The second lens array 413 has the following function. That is, the second lens array 413 forms an image emitted from each small lens of the first lens array 412 on an image forming region of the liquid crystal panel 441 (to be described below) of the electro-optical device 44, together with the superimposing lens 415 disposed on a rear stage of an optical path of the second lens array 413.

The polarization converting element 414 is disposed between the second lens array 413 and the superimposing lens 415, and converts the light emitted from the second lens array 413 into one type of linearly polarized light.

Specifically, each partial light that is converted into one kind of linearly polarized light by the polarization converting element 414 is finally superimposed on the image forming region of the liquid crystal panel 441 to be described below by means of the superimposing lens 415. In the projector that uses the liquid crystal panel of a type that modulates polarized light, since only one kind of polarized light can be used, it is not possible to use only half of the light emitted from the light source device 411 that emits the random polarized light. For this reason, when the polarization converting element 414 is used, the light emitted from the light source device 411 is converted into one kind of linearly polarized light, and light using efficiency in the electro-optical device 44 is improved.

The color separation optical device 42 includes two dichroic mirrors 421 and 422, and a reflective mirror 423, and has a function of separating the plurality of partial light beams emitted from the illumination optical device 41 by the dichroic mirrors 421 and 422 into three color light beams of red, green, and blue.

The relay optical device 43 includes an incident-side lens 431, a relay lens 433, and reflective mirrors 432 and 434, and has a function of guiding a red light beam separated by the color separation optical device 42 to a liquid crystal panel 441 (441R) for red light.

At this time, in the dichroic mirror 421 of the color separation optical device 42, a red light component and a green light component of a light beam that are emitted from the illumination optical device 41 are transmitted, and a blue light component is reflected. The blue light beam that is reflected by the dichroic mirror 421 is reflected on the reflection mirror 423, passes through a field lens 419, and reaches a light crystal panel 441 (441B) for blue light. The field lens 419 converts each partial light beam emitted from the second lens array 413 into a light beam parallel to a central axis (main light ray) of each partial light beam. This is applicable to the field lenses 419 that are provided on the light incident sides of the liquid crystal panels 441 (441G and 441R) for green light and red light.

Between the red light and the green light that have transmitted the dichroic mirror 421, the green light is reflected by the dichroic mirror 422, passes through the field lens 419, and reaches a light crystal panel 441 (441G) for green light. Meanwhile, the red light transmits the dichroic mirror 422 to pass the relay optical device 43, passes through the field lens 419, and reaches the liquid crystal pane 441 (441R) for red light. The reason why the relay optical device 43 is disposed on an optical path of red light is to prevent light using efficiency from being lowered due to light diffusion because the length of the optical path of the red light is longer than the length of the optical path of the other light. That is, the reason is to transmit a partial light beam incident on the incident-side lens 431 to the field lens 419. Further, the relay optical device 43 is constructed to transmit only the red light component among three color light components, but the invention is not limited thereto. For example, the relay optical device 43 may transmit the blue light.

The electro-optical device 44 modulates each of the three color light components emitted from the color separation optical device 42 according to image information, and synthesizes the modulated color components to form an optical image (color image). The electro-optical device 44 includes three liquid crystal panels 441 (light crystal panel 441R for red light, liquid crystal panel 441G for green light, and liquid crystal panel 441B for blue light) that serve as light modulating devices, three incident-side polarizing plates 442 that are disposed on light beam incident sides of the liquid crystal panels 441, three viewing angle compensating plates 443 that are disposed on light-emission sides of the liquid crystal panels 441, three emission-side polarizing plates 444 that are disposed on light-emission sides of the three viewing angle compensating plates 443, and a cross dichroic prism 445 that serves as a color synthesis optical device. Among the components, the liquid crystal panel 441, the viewing angle compensating plate 443, the emission-side polarizing plate 444, and the cross dichroic prism 445 are integrated with one another by a fixed member (not shown), which forms an electro-optical device main body 440 (see FIG. 3).

On the incident-side polarizing plate 442, color light components whose polarization directions are made uniform in substantially one direction by the polarization converting element 414 are incident. Among the incident light beams, the incident-side polarizing plate 442 transmits only polarized light of substantially the same direction as a polarization axis of each of the light beams whose polarization directions have been made uniform by the polarization converting element 414, and absorbs the other light beams. For example, the incident-side polarizing plate 442 has a structure in which a polarization film is attached to a light transmitting substrate that is made of sapphire glass or quartz.

The liquid crystal panel 441 has a structure where liquid crystal serving as an electro-optical material is sealed between a pair of transparent glass substrates. In the liquid crystal panel 441, an alignment state of the liquid crystal in an image forming region is controlled according to a driving signal input by the control device 8, and a polarization direction of a polarized light beam emitted from the incident-side polarizing plate 442 is modulated, thereby forming a color image according to an incident color light component.

The viewing angle compensating plate 443 is formed in a film shape. In the case where the light beam is incident on the liquid crystal panel 441 to be inclined (incident to be inclined to a normal direction of a light beam incident surface of the liquid crystal panel 441), the viewing angle compensating plate 443 compensates for a phase difference that is generated between normal light and abnormal light due to birefringence generated in the liquid crystal panel 441. The viewing angle compensating plate 443 is an optical anisotropic body having negative uniaxis, and its optical axis is oriented in a predetermined direction in a film surface and is aligned to be inclined at a predetermined angle from the film surface to an out-of-plane direction.

The viewing angle compensating plate 443 can be constructed by forming a discotic compound layer on a transparent supporting body, which is made of, for example, triacetylcellulose (TAC) or the like, with an alignment film interposed therebetween, and may use a WV film (manufactured by Fuji Photo Film Co., Ltd.).

Among the light beams that have been emitted from the liquid crystal panel 441 and have passed through the viewing angle compensating plate 443, the emission-side polarizing plate 444 transmits only the light beam having a polarization axis orthogonal to a transmission axis of the light beam in the incident-side polarization plate 442, and absorbs the other light beams.

The cross dichroic prism 445 is an optical element that synthesizes color light components serving as color images emitted from the emission-side polarizing plate 444 and forms an optical image (color image). The cross dichroic prism 445 has four right-angle prisms attached to one another and forms a square shape in plan view. In the interface of the cross dichroic prism 445 where the four right-angle prisms are attached to one another, two dielectric multilayered films are formed. The dielectric multilayered films transmit the color light component having passed through the emission-side polarizing plate 444 that is disposed on the side opposite to the projection lens 3 (side of the G color light component), and reflects the color light components having passed through the remaining two emission-side polarizing plates 444 (sides of the R color light component and the B color light component). In this way, the color light components that are modulated by each incident-side polarizing plate 442, each liquid crystal panel 441, each viewing angle compensating plate 443, and each emission-side polarizing plate 444 are synthesized, thereby forming a color image.

In the optical component casing 45, a predetermined illumination optical axis A is set, and the above-described optical components 41 to 44 are disposed at predetermined locations with respect to the illumination optical axis A. The optical component casing 45 is a box-like member that is made of a synthesis resin, and supports and fixes the projection lens 3 at the predetermined location.

As shown in FIG. 2, the optical component casing 45 includes a light source accommodating member 451 that accommodates a light source device 411, a component accommodating member 452 that accommodates the optical components 41 to 44 other than the light source device 411, and a covering member 453 that closes a component accommodating opening of the component accommodating member 452.

Among them, the light source accommodating member 451 is constructed as a box-like member that opens upward and has a U shape in longitudinal cross-sectional view. The light source accommodating member 451 is constructed such that the light source device 411 can be exchanged through the opening 21A2 that is formed on the top surface 21A of the above-described upper case 21.

Further, the component accommodating member 452 is a box-like member that has a component accommodating opening formed upward and has a U shape in longitudinal cross-sectional view. The component accommodating member 452 is connected to the light source accommodating member 451. Although not shown in detail in the drawing, on the side wall of the component accommodating member 452 that is connected to the light source accommodating member 451, an opening is formed to transmit the light beam emitted from the light source device 411 that is accommodated in the light source accommodating member 451. Furthermore, although not shown in detail in the drawing, a plurality of grooves, which locate and fix the optical components 41 to 44 other than the light source device 411, are formed in the component accommodating member 452.

Structure of Power Supply Unit

Referring to FIG. 2 again, the power supply unit 5 supplies power to the individual electronic components that form the projector 1. The power supply unit 5 is disposed in parallel to the optical unit 4 in a longitudinal direction of the projector 1, and is covered with an electromagnetic shield material 51 for preventing EMI (electromagnetic interference). The power supply unit 5 includes a power supply block and a light source driving block, although not shown in detail in the drawing.

Between the power supply block and the light source driving block, the power supply block converts the commercial alternating current input through a power cable (not shown) into a direct current and elevates and decompresses the direct current with a voltage according to the individual electronic component, and then supplies the current to the individual electronic components such as the light source driving block and the control unit.

The light source driving block rectifies and transforms the direct current supplied from the power supply block, generates an alternating current rectangular-wave current, and supplies the alternating current rectangular-wave current to the light source lamp 416 of the light source device 411 so as to turn on the light source lamp 416. The light source driving bock is electrically connected to the control unit, and the control unit controls turned on/off of the light source lamp 416 through the light source driving block.

Structure of Cooling Unit

The cooling unit 6 introduces cooling air from the outside of the projector 1, and cools the cooled objects, such as the electronic components or the optical components, which form the projector 1. As shown in FIG. 2, the cooling unit 6 includes a first cooling system 61 that cools the liquid crystal panel 441 or the like, a second cooling system 62 that cools the power supply unit 5, a third cooling system 63 that cools the light source lamp 416, and an exhaust system 64 that discharges the cooling air supplied when cooling the first to third cooling systems 61 to 63 to the outside of the projector 1.

Among them, the second cooling system 62 includes an axial-flow fan 621 that is disposed at a location along the projection direction of the projection lens 3. The second cooling system 62 blows the cooling air introduced from the outside of the projector 1 to the inside of the exterior casing 2 by means of the first cooling system 61 to the power supply unit 5, and cools the power supply unit 5.

The third cooling system 63 includes a sirocco fan 631 that blows the air in the exterior casing 2 to the light source device 411 through a duct (not shown). The cooing air that is blown to the light source device 411 circulates in the light source accommodating member 451 of the optical component casing 45, and cools the light source lamp 416 of the light source device 411 that is accommodated in the light source accommodating member 451.

Figure 4:
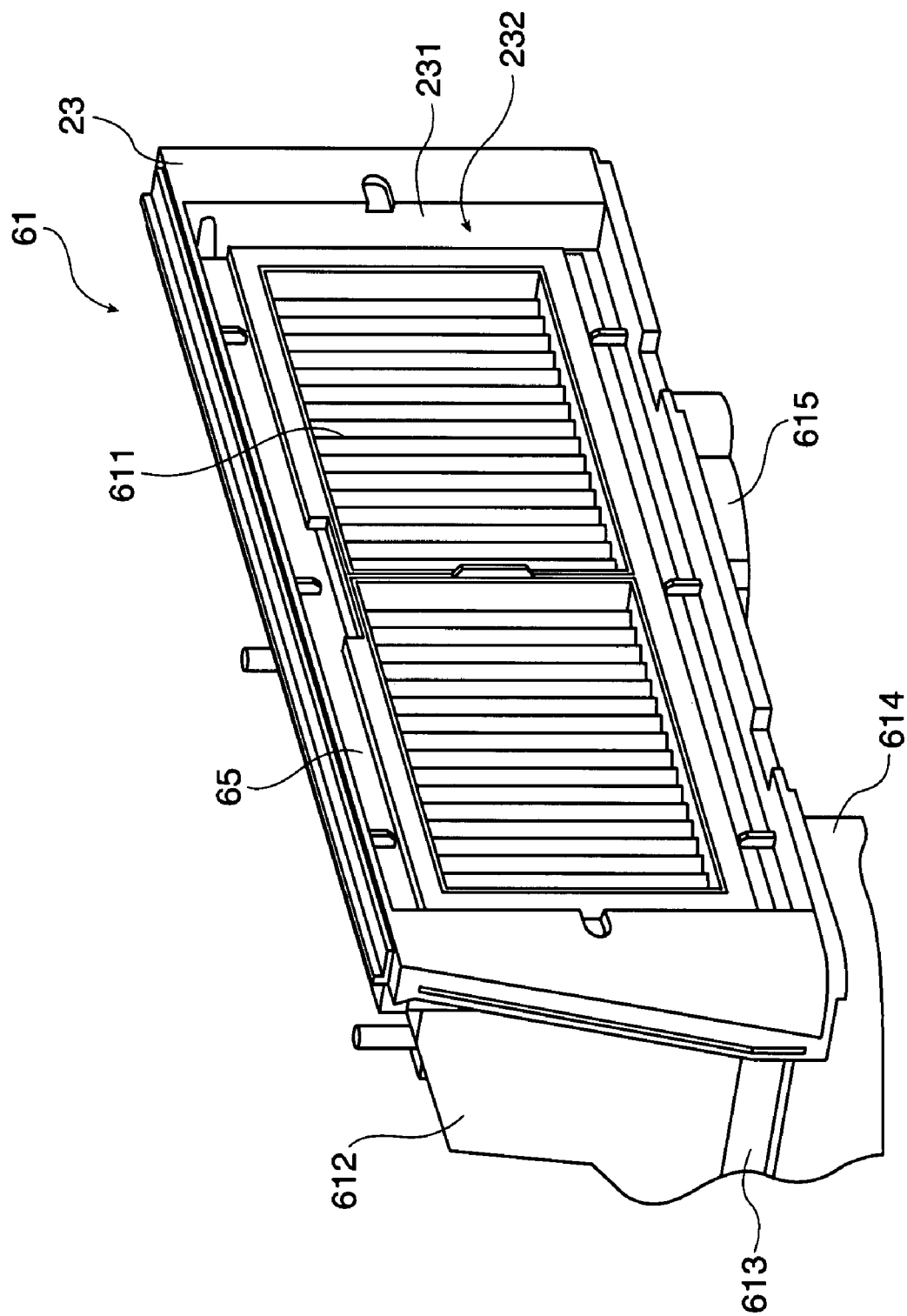
FIG. 4 is a perspective view illustrating a portion of a first cooling system according to the embodiment.

FIG. 4 is a perspective view illustrating a portion of the first cooling system 61.

The first cooling system 61 introduces the cooling air from the outside of the projector 1 through the opening 232 formed in the side case 23, an cools the electro-optical device 44 such as the liquid crystal panel 441 and the polarization converting element 414 as the cooled objects.

Figure 6:
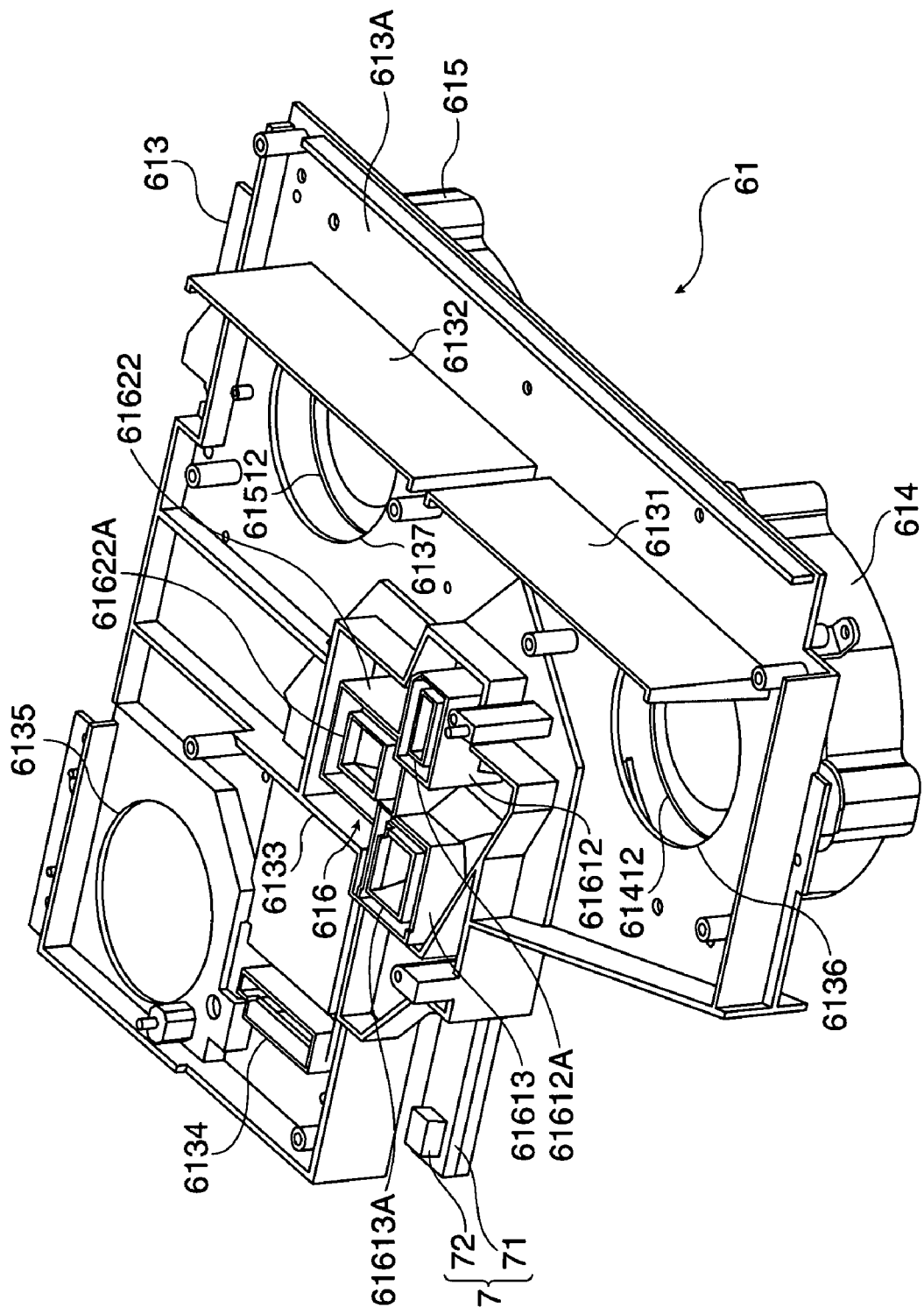
FIG. 6 is a perspective view illustrating a state where a cooling fan, a second duct, and a wind velocity measuring device are assembled in a base duct according to the embodiment, when viewed from an upper side.
Figure 7:
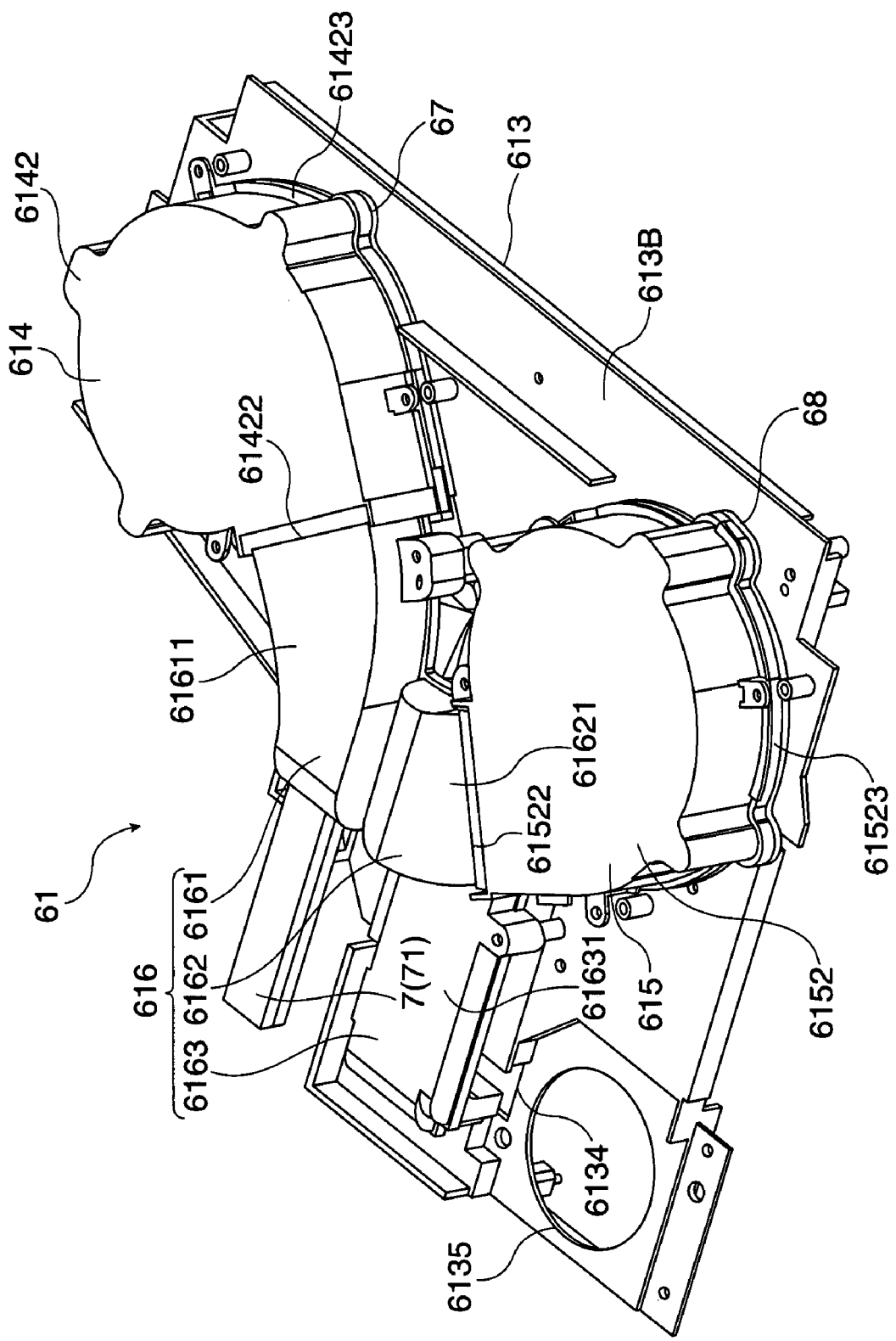
FIG. 7 is a perspective view illustrating a state shown in FIG. 6, when viewed from a lower side.
Figure 8:
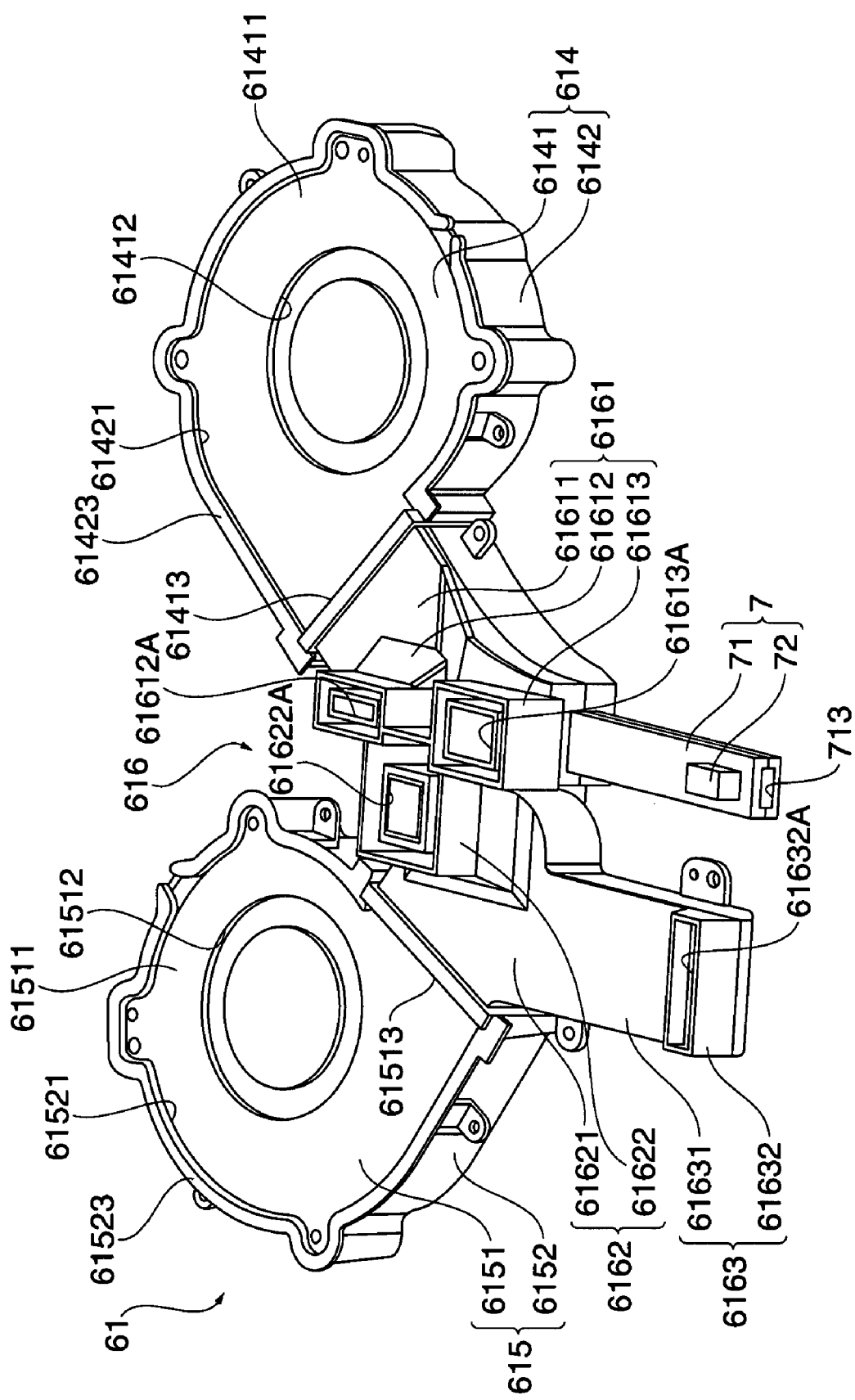
FIG. 8 is a perspective view illustrating a cooling fan, a second duct, and a wind velocity measuring device according to the embodiment.

As shown in FIGS. 2 and 4, the first cooling system 61 includes a filter 611 (see FIG. 4), a first duct 612, a base duct 613 (see FIG. 4), two cooling fans 614 and 615, and a second duct 616 (see FIGS. 6 to 8). Among them, the two cooling fans 614 and 615 correspond to the cooling fans according to the aspect of the invention, and the second duct 616 corresponds to the duct according to the aspect of the invention.

As shown in FIG. 4, the filter 611 is provided to be freely removed in the exterior casing 2 that corresponds to the opening 232. The filter 611 performs a cleaning process on the air introduced from the opening 232, and is fixed to the concave portion 231 of the side case 23 and the first duct 612.

In this case, a first cushion 65 is interposed between the filter 611, and the inner surface of the side case 23 forming the opening 232, as shown in FIG. 4.

The first cushion 65 is a cushion made of a synthesis resin having an elastic force, and is provided to closely adhere to the filter 611 and the side case 23 so as to bury the gap between the filter 611 and the side case 23. For this reason, when the cooling fans 614 and 615 to be described below are driven and the cooling air is introduced into the exterior casing 2 from the opening 232, most of the cooling air becomes introduced into the exterior casing 2 after passing through the filter 611. Therefore, the air having been subjected to the cleaning process by the filter 611 is introduced into the exterior casing 2.

Figure 5:
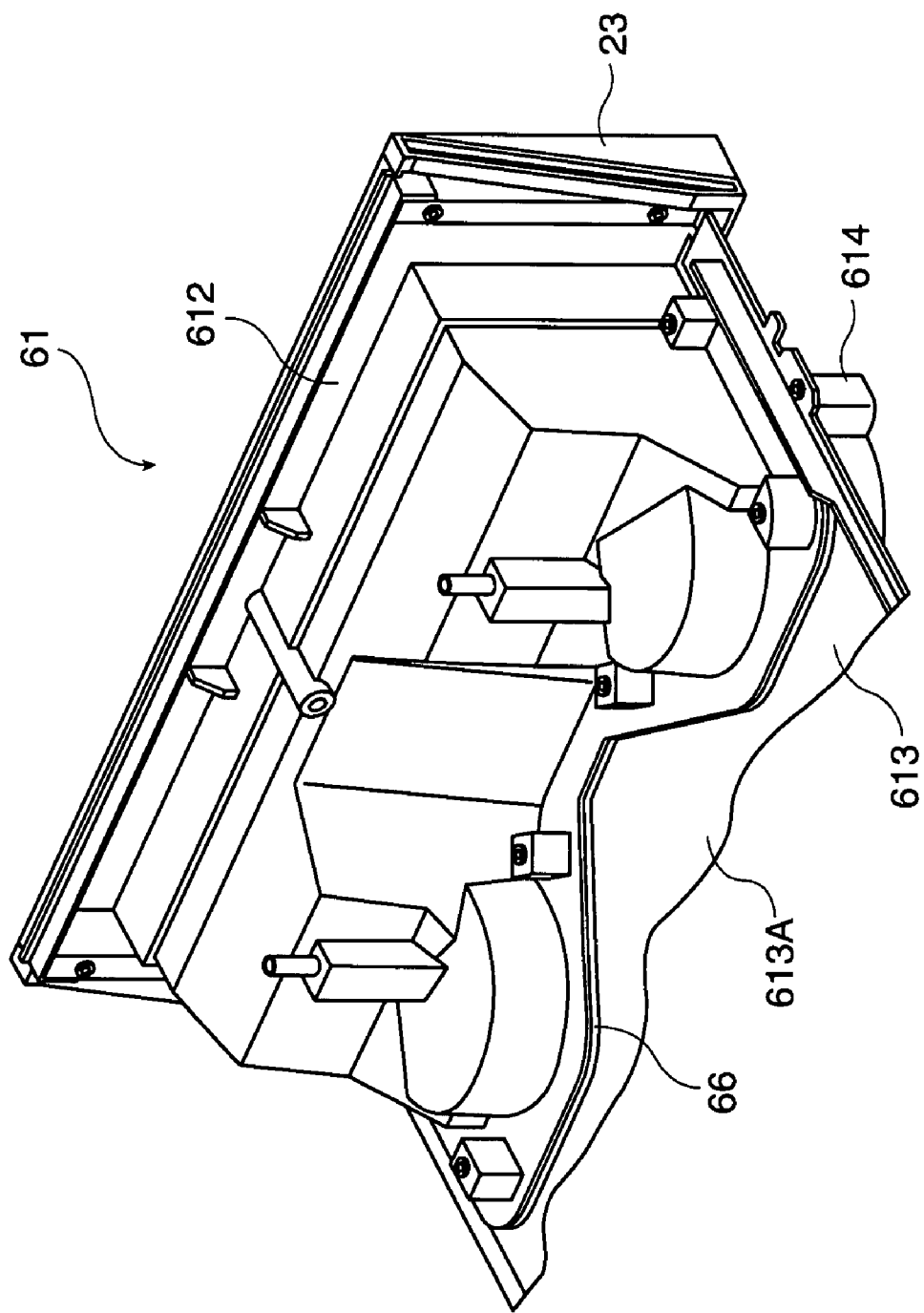
FIG. 5 is a diagram illustrating a portion of a first cooling system according to the embodiment.

FIG. 5 is a diagram illustrating a portion of the first cooling system 61. Specifically, FIG. 5 is a diagram illustrating the first cooling system 61 when viewed from the opposite side to the case in FIG. 4.

As shown in FIGS. 4 and 5, in order to cover the opening 232, the first duct 612 is fixed on the inside surface of the side case 23 and the top surface 613A of the base duct 613 by means of a screw. The first duct 612 is composed of a box-like member that opens in a horizontal direction and has a U shape in longitudinal cross-sectional view, and connects the opening 232 and the top surface 613A of the base duct 613. Although not shown in detail in the drawing, in the first duct 612, a wind guiding plate is provided. In this case, the wind guiding plate guides the air of the opening 232, which circulates from the left side of FIG. 4, to the opening 6136 (see FIG. 6) formed in the base duct 613, and guides the air of the opening 232, which circulates from the right side of FIG. 4, to the opening 6137 (see FIG. 6) formed in the base duct 613.

In this case, between the first duct 612 and the base duct 613, a second cushion 66 is interposed, as shown in FIG. 5. The second cushion 66 covers the bottom surface of the first duct 612 and buries the gap between the first duct 612 and the base duct 613. Similar to the first cushion 65, the second cushion 66 is composed of a synthesis resin cushion having an elastic force. For this reason, the air that circulates in the first duct 612 is sucked in the cooling fans 614 and 615 through the base duct 613 without leaking.

FIG. 6 is a perspective view illustrating a state where the cooling fans 614 and 615, the second duct 616, and the wind velocity measuring device 7 are assembled in the base duct 613, when viewed from an upper side.

FIG. 7 is a perspective view illustrating the state shown in FIG. 6, when viewed from a lower side.

The base duct 613 is a member that guides the air having circulated in the inside of the first duct 612 to suction ports of the cooling fans 614 and 615, is mounted on the inner side of the bottom surface of the lower case 22, and supports the filter 611, the first duct 612, the cooling fans 614 and 615, and the second duct 616.

Specifically, on the top surface 613A of the base duct 613, the filter 611 and the first duct 612 are mounted. Further, as shown in FIG. 7, on the bottom surface 613B of the base duct 613, the cooling fans 614 and 615, and the second duct 616 are mounted.

As shown in FIG. 6, the base duct 613 is formed in an L shape in plan view. The base duct 613 includes plate-shaped rectifying portions 6131 and 6132 that are erected on the top surface 613A, an opening 6133 that is formed at substantially the center of the base duct 613, an opening 6134 that has a rectangular shape, and three circular openings 6135, 6136, and 6137.

Among them, the rectifying portions 6131 and 6132 are provided to be substantially orthogonal to a circulating direction of the air in the first duct 612 whose end face (plate surface) is mounted on the base duct 613, and rectify the flow of the air.

In the opening 6133 that is formed at substantially the center of the base duct 613, a portion of the second duct 616 is exposed, as shown in FIG. 6. The opening 6133 is formed at a location corresponding to the electro-optical device 44 that forms the optical unit 4. In addition, the air, which is sucked from the outside of the projector 1 by the cooling fans 614 and 615 mounted on the bottom surface 613B, through the first duct 612 mounted on the top surface 613A of the base duct 613, is blown to the electro-optical device 44 through the second duct 616.

In the base duct 613, in the rectangular opening 6134 that is formed at the location apart from the rectifying portions 6131 and 6132, specifically, the location apart from the side case 23, the cooling air is blown from the cooling fan 615 through the second duct 616. The forming location of the opening 6134 corresponds to the location of the polarization converting element 414 that forms the optical unit 4. The cooling air introduced from the outside of the projector 1 is blown from the cooling fan 615 to the polarization converting element 414 through the second duct 616 and the opening 6134.

At the location that corresponds to the opening 6135 formed at the location apart from the rectifying portions 6131 and 6132 among the three circular openings 6135, 6136, and 6137 formed in the base duct 613, the sirocco fan 631 constituting the third cooling system 63 is mounted on the side of the bottom surface 613B. For this reason, the air, which is introduced into the exterior casing 2 by means of the first cooling system 61 and cools the electro-optical device 44, is sucked in the sirocco fan 631 through the opening 6135, and is blown to the light source device 411.

When the first duct 612 is mounted on the base duct 613, the openings 6136 and 6137 are formed at the locations that cover the inside of the first duct 612. On the side of the bottom surface 613B that corresponds to the openings 6136 and 6137, the cooling fans 614 and 615 are mounted. Specifically, at the location that corresponds to the opening 6136, the cooling fan 614 is mounted toward the suction port 61412 of the opening 6136, and at the location that corresponds to the opening 6137, the cooling fan 615 is mounted toward the suction port 61512. For this reason, the cooling air, which is introduced from the outside of the exterior casing 2 through the first duct 612, is sucked in the cooling fans 614 and 615 through the openings 6136 and 6137.

FIG. 8 is a perspective view illustrating the cooling fans 614 and 615, the second duct 616, and the wind velocity measuring device 7.

The cooling fans 614 and 615 suck the air introduced from the opening 232 that is formed in the side case 23 and blow the air to the electro-optical device 44 such as the liquid crystal panel 441 and the polarization converting element 414, and are mounted at the locations that correspond to the openings 6136 and 6137 of the bottom surface 613B of the base duct 613.

As shown in FIG. 8, the cooling fans 614 and 615 include the fan main bodies 6141 and 6151 and the fan covers 6142 and 6152, respectively.

Although not shown in detail in the drawing, the fan main bodies 6141 and 6151 include motors (not shown) that serve as rotation driving sources where a plurality of blade members are provided on a rotational shaft, and casings 61411 and 61511 that accommodate the motors. Each of the fan main bodies 6141 and 6151 can be composed of a sirocco fan.

In the casings 61411 and 61511, suction ports 61412 and 61512 are formed on the surfaces substantially orthogonal to the rotation shafts of the motors, and on the surfaces along the rotation shafts of the motors, blowing ports 61413 and 61513 are formed which blows the air sucked from the suction ports 61412 and 61512 according to the rotations of the motors.

The fan covers 6142 and 6152 have the same outer shapes as the fan main bodies 6141 and 6151, and are constructed as box-like members where openings 61421 and 61521 are formed upward. In the fan covers 6142 and 6152, the fan main bodies 6141 and 6151 are accommodated through the openings 61421 and 61521.

In the fan covers 6142 and 6152, the openings 61422 and 61522 (see FIG. 7) are formed at locations that correspond to the blowing ports 61413 and 61513 of the fan main bodies 6141 and 6151. Further, the second duct 616 is connected to the openings 61422 and 61522, and the cooling air sucked by the fan main bodies 6141 and 6151 are blown to the second duct 616 through the openings 61422 and 61522.

That is, the entire fan main bodies 6141 and 6151, except for the surfaces where the suction ports 61412 and 61512 are formed and the blowing ports 61413 and 61513, are covered with the fan covers 6142 and 6152. In this state, the cooling fans 614 and 615 are fixed on the bottom surface 613B of the base duct 613 by means of a screw.

In the fan covers 6142 and 6152, on the top surfaces of the side walls forming the openings 61421 and 61521, that is, the surfaces facing the bottom surface 613B of the base duct 613, ribs 61423 and 61523 that are erected in an out-of-plane direction of the corresponding surfaces are formed.

The ribs 61423 and 61523 are formed so as to surround the peripheral portions of the openings 61421 and 61521 accommodating the fan main bodies 6141 and 6151 by the fan covers 6142 and 6152. In addition, the ribs 61423 and 61523 press the third cushion 67 (see FIG. 7) and the fourth cushion 68 (see FIG. 7) that are interposed between the fan covers 6142 and 6152 and the bottom surface 613B of the base duct 613.

Similar to the first cushion 65 and the second cushion 66, the third cushion 67 and the fourth cushion 68 are synthesis resin cushions having an elastic force. That is, the third cushion 67 and the fourth cushion 68 close the gap between the base duct 613 and the fan covers 6142 and 6152, which prevents the air in the exterior casing 2 from flowing into the suction ports 61412 and 61512 of the cooling fans 614 and 615. For this reason, when the fan main bodies 6141 and 6151 of the cooling fans 614 and 615 are driven, only the air having circulated the inside of the first duct 612 flows in the suction ports 61412 and 61512 of the fan main bodies 6141 and 6151 through the openings 6136 and 6137 formed in the base duct 613.

The second duct 616 is composed of a pair of duct portions 616A and 616B (see FIG. 9) that are synthesis resin forming products to be formed divisionally according to the horizontal plane, and the pair of duct portions 616A and 616B are combined with each other to cause the air to be circulated in the inside of the second duct 616. In addition, the second duct 616 guides the cooling air blown from the cooling fans 614 and 615 to the electro-optical device 44 such as the liquid crystal panel 441 and the polarization converting element 414. The second duct 616 is fixed to the bottom surface 613B of the base duct 613 by means of a screw, and a portion of the duct portion 616A that is located upward is exposed to the side of the top surface 613A through the opening 6133 formed in the base duct 613. As shown in FIGS. 7 and 8, the first wind guiding portion 6161, the second wind guiding portion 6162, and the third wind guiding portion 6163 are formed in the second duct 616.

The first wind guiding portion 6161 blows the cooing air blown from the cooing fan 614 to each of the liquid crystal panels 441R and 441B. The first wind guiding portion 6161 is connected to the opening 61422 of the cooing fan 614, and includes a circulating portion 61611 in which the air blown from the cooling fan 614 circulates, an extending portion 61612 that is branched from the circulating portion 61611 and extends to the liquid crystal panel 441R of the electro-optical device 44, and another extending portion 61613 that is branched from the circulating portion 61611 and extends to the liquid crystal panel 441B. In the extending portions 61612 and 61613, the openings 61612A and 61613A are formed at locations that correspond to the liquid crystal panels 441R and 441B, and the cooling air that circulates in the circulating portion 61611 is distributed in the extending portions 61612 and 61613.

That is, after the air blown from the cooling fan 614 circulates in the space Ar1 (see FIG. 9) in the circulating portion 61611 of the first wind guiding portion 6161, the air is distributed to the extending portions 61612 and 61613.

The cooing air that is distributed to the extending portion 61612 is discharged from the opening 61612A that is formed in the extending portion 61612, and cools the liquid crystal panel 441R, the incident-side polarizing plate 442 that is disposed on the light beam incident side and the light beam emission side of the liquid crystal panel 441R, the viewing angle compensating plate 443, and the emission-side polarizing plate 444.

Meanwhile, the cooling air that is distributed to the extending portion 61613 is discharged from the opening 61613A that is formed in the extending portion 61613, and cools the liquid crystal panel 441B, the incident-side polarizing plate 442 that is disposed on the light beam incident side and the light beam emission side of the liquid crystal panel 441B, the viewing angle compensating plate 443, and the emission side polarizing plate 444.

The second wind guiding portion 6162 guides the air blown from the cooling fan 615 to the liquid crystal panel 441G. The second wind guiding portion 6162 is connected to the opening 61522 of the cooling fan 615, and includes a circulating portion 6162 where the cooling air blown from the cooling fan 615 circulates in the inside of the circulating portion 6162, and an extending portion 61622 that is branched from the circulating portion 61621 and extends to the liquid crystal panel 441G. In the extending portion 61622, the opening 61622A is formed at the location that corresponds to the liquid crystal panel 441G.

Further, the third wind guiding portion 6163 guides a portion of the cooling air blown from the cooling fan 615 to the polarization converting element 414. The third wind guiding portion 6163 is connected to the circulating portion 61621 of the second wind guiding portion 6162, and includes a circulating portion 61631 in which the portion of the cooling air branched from the circulating portion 61621 circulates, and an extending portion 61632 that extends from the circulating portion 61631 to the polarization converting element 414. In the extending portion 61632, the opening 61632A is formed at the location that corresponds to the polarization converting element 414.

That is, after the air blown from the cooling fan 615 circulates in the space (not shown) in the circulating portion 61621 of the second wind guiding portion 6162, a portion of the air is distributed to the extending portion 61622 and the other portion is distributed to the circulating portion 61631 of the third wind guiding portion 6163.

In this case, the air that circulates in the extending portion 61622 is discharged from the opening 61622A, and cools the liquid crystal panel 441G, the incident-side polarizing plate 442 that is disposed on the light beam incident side and the light beam emission side of the liquid crystal panel 441G, the viewing angle compensating plate 443, and the emission-side polarizing plate 444.

Further, the air that circulates in the circulating portion 61631 of the third wind guiding portion 6163 circulates in the extending portion 61632 connected to the circulating portion 61631, is discharged through the opening 61632A, and cools the polarization converting element 414.

The cooing air that has cooled the electro-optical device 44 and the polarization converting element 414 circulates in the exterior casing 2, is sucked by the axial-flow fan 621 constituting the second cooling system 62, cools the power supply unit 5, is sucked by the sirocco fan 631 constituting the third cooling system 63, and cools the light source device 411. In addition, the air that has cooled the light source device 411 and the power supply unit 5 is sucked by the axial-flow fan 642 through the duct 641 constituting the exhaust system 64, and is discharged to the outside of the exterior casing 2 through the exhaust port (not shown) that is formed in the upper case 21.

Structure of Wind Velocity Measuring Device

Figure 9:
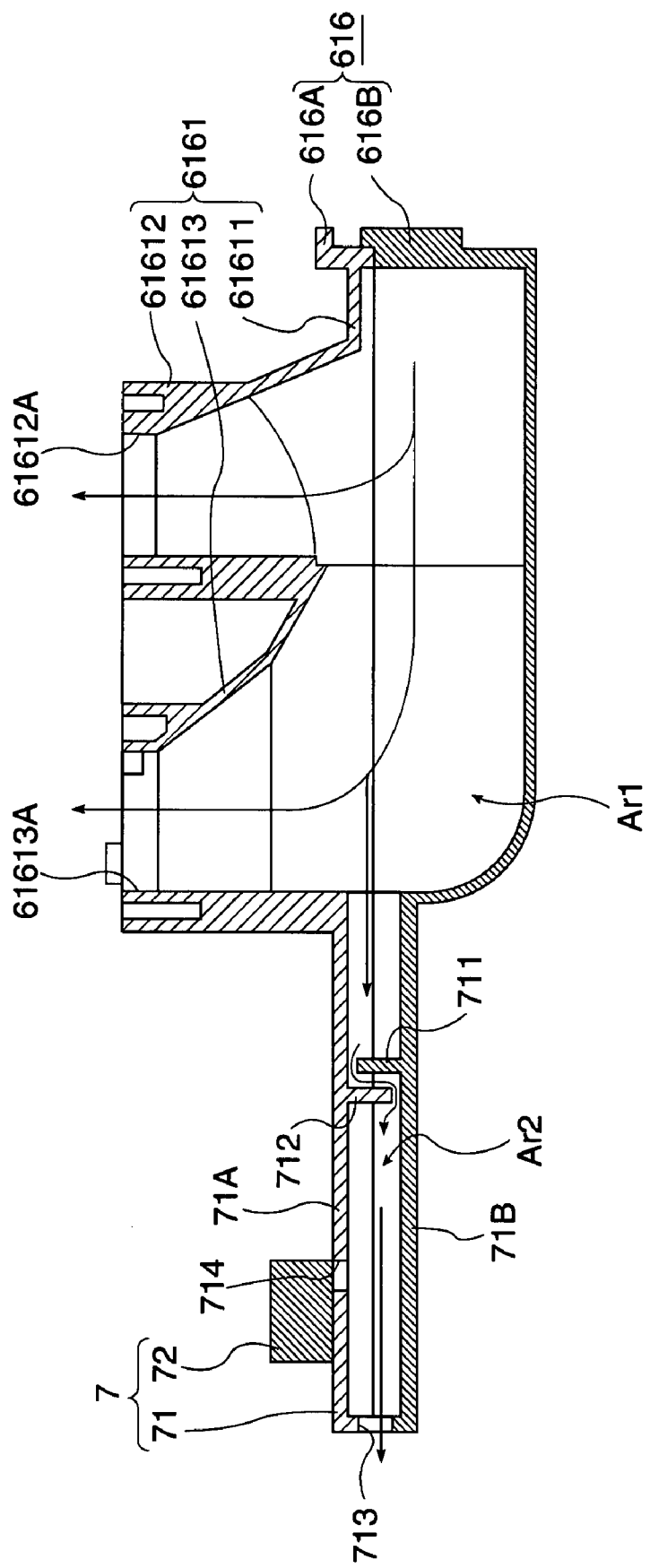
FIG. 9 is a cross-sectional view illustrating an inner structure of a wind velocity measuring device according to the embodiment.

FIG. 9 is a cross-sectional view illustrating an inner structure of a wind velocity measuring device 7.

The wind velocity measuring device 7 measures a wind velocity of air that is blown to the electro-optical device 44 to be a cooled object by the cooling unit 6. As shown in FIGS. 6 to 9, the wind velocity measuring device 7 includes an air circulating unit 71 with a wind velocity measurement channel 715 formed therein, and a wind velocity sensor 72 serving as a wind velocity measuring unit.

As shown in FIGS. 8 or 9, the air circulating unit 71 has a rectangular parallelepiped shape in plan view, is connected to a front end of a circulating direction of the air in the circulating portion 61611 that forms the first wind guiding portion 6161, and is constructed to be integrated with the second duct 616. That is, the air circulating unit 71 is formed to be divided into two bodies of a pair of circulating members 71A and 71B that are constructed to be integrated with the pair of duct portions 616A and 616b in the second duct portion 616. In addition, the air circulating unit 71 has a substantially frame shape in sectional view by combining the pair of circulating members 71A and 71B with each other, and can circulates a portion of the air circulating in the space Ar1. Specifically, the air circulating unit 71 is formed such that a sectional area of a flow passage of the air in the air circulating unit 71 becomes sufficiently smaller than a sectional area of a flow passage of the air in the space Ar1, as shown in FIG. 9.

In the air circulating unit 71, on the front stage side of the flow passage, the wind velocity measurement channel 715 receives inner air from space Ar1 and a pair of flat barrier portions 711 and 712 are formed which extend to be substantially orthogonal to the direction of the airflow within the wind velocity measurement channel 715, as shown in FIG. 9.

Specifically, as shown in FIG. 9, the barrier portion 711 is erected on an inside surface (upper end face) of the circulating member 71B located below the barrier member 711. Further, in the inside surface (lower end face) of the circulating member 71A located above the barrier member 712, as shown in FIG. 9, in a state where a pair of circulating members 71A and 71B are combined with each other, the barrier portion 712 is erected at a location of the rear stage side of the flow passage more than the barrier portion 711. In addition, the pair of barrier portions 711 and 712 are formed such that their surfaces interfere with each other two-dimensionally when viewed from a flow passage direction.

That is, as shown in FIG. 9, when a portion of the air that circulates in the space Ar1 flows into the air circulating unit 71, the air circulates in the gap between the pair of barrier portions 711 and 712. That is, the pair of barrier portions 711 and 712 divide the inner pressure of the space Ar1 and the inner pressure of the space Ar2 located at the rear stage side of the flow passage more than the pair of barrier portions 711 and 712, and sufficiently lowers the inner pressure of the space Ar2 with respect to the inner pressure of the space Ar1.

Further, in the end of the air circulating unit 71 at the rear stage side of the flow passage, the exhaust port 713 is formed to discharge the air in the air circulating unit 71 to the outside, as shown in FIGS. 8 or 9.

That is, the exhaust port 713 increases a flow rate of the air that circulates in the space Ar2. Accordingly, the exhaust port 713 has a function of sufficiently lowering the inner pressure of the space Ar2 and stabilizing the inner pressure and the wind velocity.

Furthermore, in the air circulating unit 71, at substantially the center between the pair of barrier portions 711 and 712 and the exhaust port 713, as shown in FIG. 9, a sensor air outlet 714 is formed to discharge the air circulating in the space Ar2 between the pair of barrier portions 711 and 712 and the exhaust port 713 to the outside.

As shown in FIG. 9, the wind velocity sensor 72 is disposed at a location that corresponds to the sensor air outlet 714 in the air circulating unit 71, and measures the wind velocity of the air that is discharged through the sensor air outlet 714. In addition, the wind velocity sensor 72 outputs the signal according to the measured wind velocity value to the control device 8.

Further, the structure of the wind velocity sensor 72 is not limited to a specific structure. For example, a wind velocity sensor can be used in which a predetermined temperature distribution is formed by heating a heater, and a variation state of the temperature distribution according to the wind velocity of the air is measured. In this embodiment, an MEMS wind velocity D6F-W01A1 or D6F-W04A1 (manufactured by Omron Corporation), which measures the wind velocity according to the above-described principle, is used.

Structure of Control Device

Figure 10:
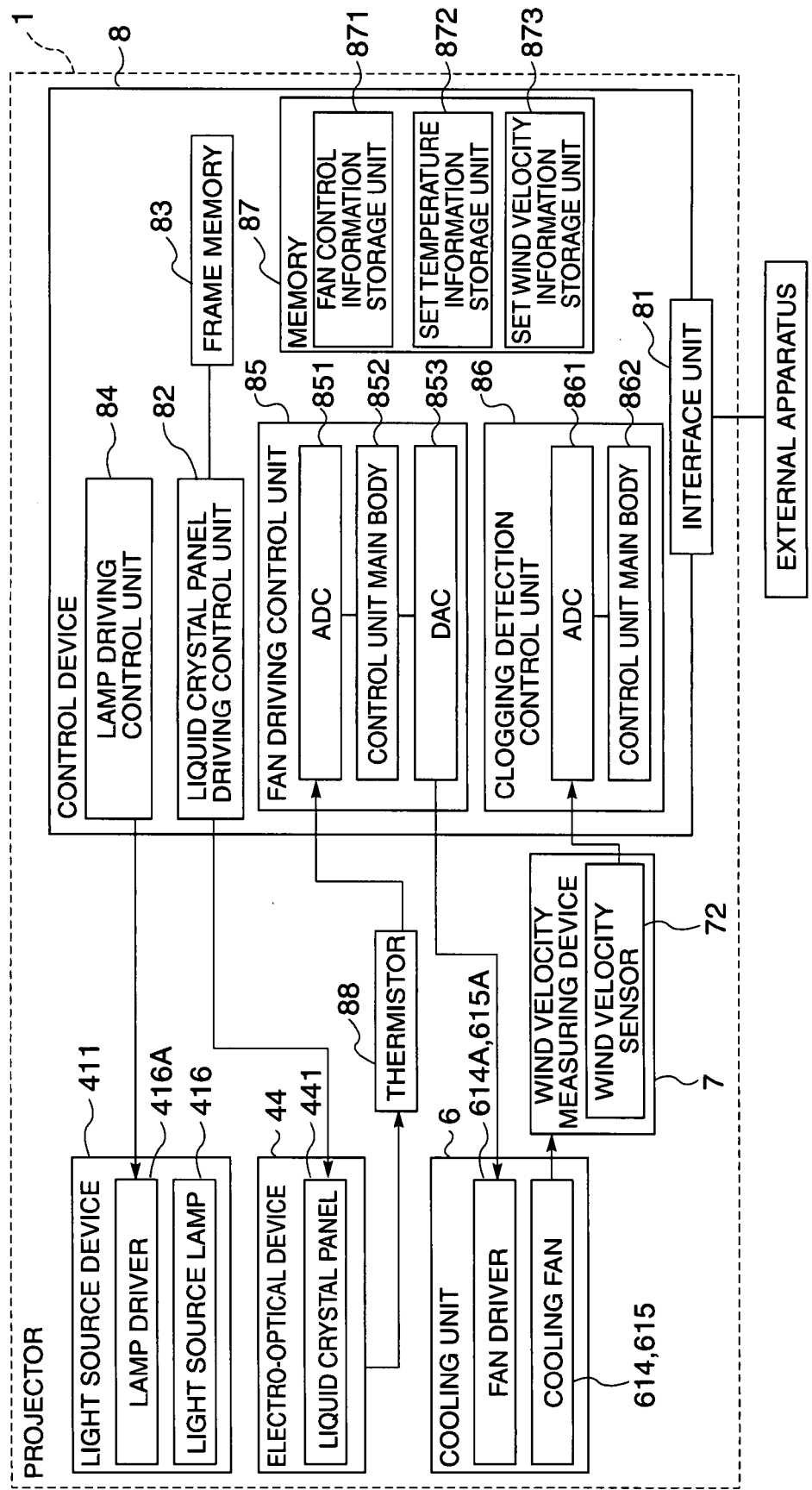
FIG. 10 is a diagram illustrating a control structure of a projector by a control unit according to the embodiment.

FIG. 10 is a block diagram illustrating a control structure of a projector 1 by a control device 8.

The control device 8 performs driving control on the entire projector 1. As shown in FIG. 10, the control device 8 includes an interface unit 81, a liquid crystal panel driving control unit 82, a frame memory 83, a lamp driving control unit 84, a fan driving control unit 85, a clogging detection control unit 86, and a memory 87.

The interface unit 81 executes a preset input interface process on the signal that is input through the signal line from the outside, and outputs the process result to the liquid crystal panel driving control unit 82 or the like. For example, the interface unit 81 receives image signals or the like output from various external apparatuses, converts the image signals into image signals that can be processed by the liquid crystal panel driving control unit 82, and outputs the converted image signals. In addition, the image signal (digital image signal) that is output from the interface unit 81 is temporarily written in the frame memory 83.

The liquid crystal panel driving control unit 82 arbitrarily reads the digital image signal that is output from the interface unit 81 and is sequentially stored in the frame memory 83, performs a predetermined process on the read digital image signal, outputs a driving signal serving as image information corresponding to the processed image to each liquid crystal panel 441, and forms a predetermined optical image. Examples of the predetermined process in the liquid crystal panel driving control unit 82 include an image size adjusting process, such as expansion and contraction, a trapezoidal distortion correction process, an image quality adjusting process, a gamma correction process, or the like. Since these processes are known technologies, the description thereof will be omitted.

In accordance with a predetermined program, the lamp driving control unit 84 outputs to the lamp driver 416A, a control command for instructing to drive the light source lamp 416 with a predetermined driving frequency, generates a driving signal according to the predetermined driving frequency in the lamp driver 416A, and drives the light source lamp 416.

In accordance with a predetermined program, the fan driving control unit 85 controls driving each of fans 614, 615, 621, and 631. In the description below, the driving control of the cooling fans 614 and 615 by the fan driving control unit 85 is mainly described, and the driving control of the other fans 621 and 631 is not described.

After the fan driving control unit 85 drives the cooling fans 614 and 615 with an initial voltage value on the basis of the fan control information stored in the memory 87, the fan driving control unit 85 sequentially recognizes the detection temperature detected by a thermistor 88 (see FIG. 10) serving as a temperature detecting unit that is disposed in the vicinity of the electro-optical device 44 to be cooled object, calculates a deviation amount between the recognized detection temperature, and a set temperature based on the set temperature information stored in the memory 87, changes a voltage applied to the cooling fans 614 and 615 on the basis of the deviation amount, and performs a feedback control such that the temperature in the vicinity of the electro-optical device 44 becomes the set temperature. Further, the feedback control may be feedback control that changes voltage applied to the cooling fans 614 and 615 on the basis of the deviation amount between the detection temperature and the set temperature, and may any one of proportional control, PI (proportional integral) control, PID (proportional integral differential) control, or the like.

In addition, as shown in FIG. 10, the fan driving control unit 85 includes an ADC (analog to digital converter) 851 that converts an analog signal output from a thermistor 88 into a digital signal, a control unit main body 852 that performs the above-described feedback control, and a DAC (digital to analog converter) 853 that outputs an analog signal (voltage) according to a predetermined input code processed and output by the control unit main body to the fan drivers 614A and 615A and drives the cooling fans 614 and 615.

When controlling the feedback control by the fan driving control unit 85, after the voltage applied to the cooling fans 614 and 615 reaches an upper limit, the clogging detection control unit 86 performs clogging detection control that determines whether the filter 611 exchange is necessary on the basis of the wind velocity value measured by the wind velocity measuring device 7, and the set wind velocity value based on the set wind velocity information stored in the memory 87. Further, when it is determined that the filter exchange is necessary, the clogging detection control unit 86 outputs a predetermined control signal to the liquid crystal panel driving control unit 82, and generates information urging (optical image) the exchange of the filter 611 in the liquid crystal panel 441.

As shown in FIG. 10, the clogging detection control unit 86 includes an ADC 861 that converts an analog signal output by the wind velocity sensor 72 into a digital signal, and a control unit main body 862 that performs the above-described process (clogging detection control or the like) on the basis of the input digital signal.

The memory 87 stores information necessary at the time of feedback control in the fan driving control unit 85, or information necessary at the time of clogging detection control in the clogging detection control unit 86. As shown in FIG. 10, the memory 87 includes a fan control information storage unit 871, a set temperature information storage unit 872, and a set wind velocity information storage unit 873.

The fan control information storage unit 871 stores fan control information that is associated with an initial voltage value when the control unit main body 852 performs feedback control.

The set temperature information storage unit 872 stores set temperature information that is associated with a set temperature when the control unit main body 852 performs feedback control. Further, the set temperature is a temperature that sets the temperature in the vicinity of the electro-optical device 44 to the predetermined temperature.

The set wind velocity information storage unit 873 stores set wind velocity information that is associated with a set wind velocity value when the control unit main body 862 performs the clogging detection control. Further, the set wind velocity value is set to a value that is slightly larger than a wind velocity value of the air when the filter 611 needs to be exchanged, that is, when the filter 611 causes the clogging.

Method of Controlling Projector

Next, a method of controlling the projector 1 by the above-described control device 8 will be described with reference to the accompanying drawings. In the below control method, the control by the fan driving control unit 85 and the clogging detection control unit 86 is mainly described, and the other control is not described.

Figure 11:
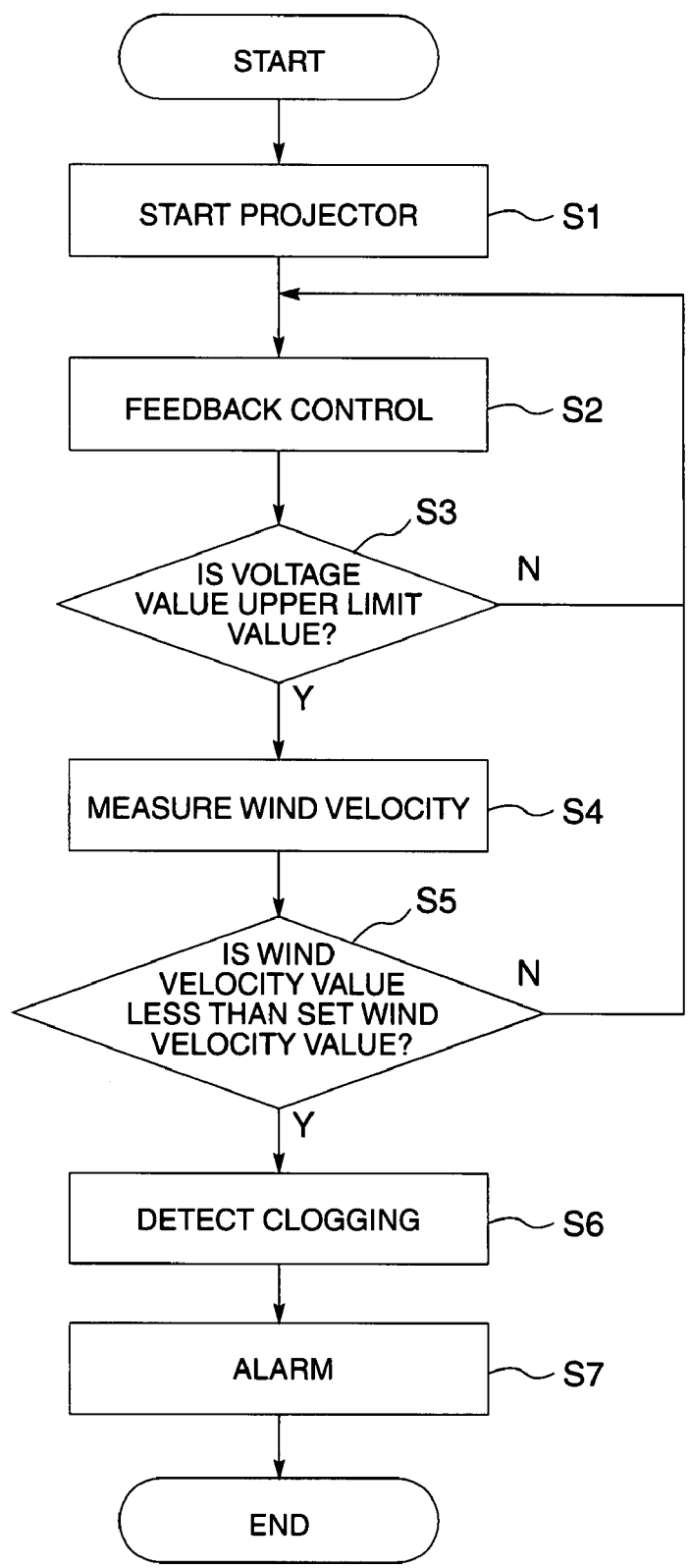
FIG. 11 is a flowchart illustrating a method of controlling a projector according to the embodiment.

FIG. 11 is a flowchart illustrating a method of controlling the projector 1.

First, when the user presses a power supply ON button (not shown) of the projector 1, a predetermined operation signal is output from the power supply ON button to the control device 8, and the control device 8 starts the projector 1 (Step S1).

After Step S1, the fan driving control unit 85 reads the fan control information and the set temperature information from the memory 87. In addition, the fan driving control unit 85 drives the cooling fans 614 and 615 with an initial voltage value on the basis of the read fan control information. In addition, the fan driving control unit 85 sequentially recognizes the detection temperature detected by the thermistor 88, calculates the deviation amount between the recognized detection temperature, and the set temperature based on the read set temperature information, changes a voltage applied to the cooling fans 614 and 615 on the basis of the deviation amount, and performs feedback control such that the temperature in the vicinity of the electro-optical device 44 becomes the set temperature (Step S2).

Figure 12:
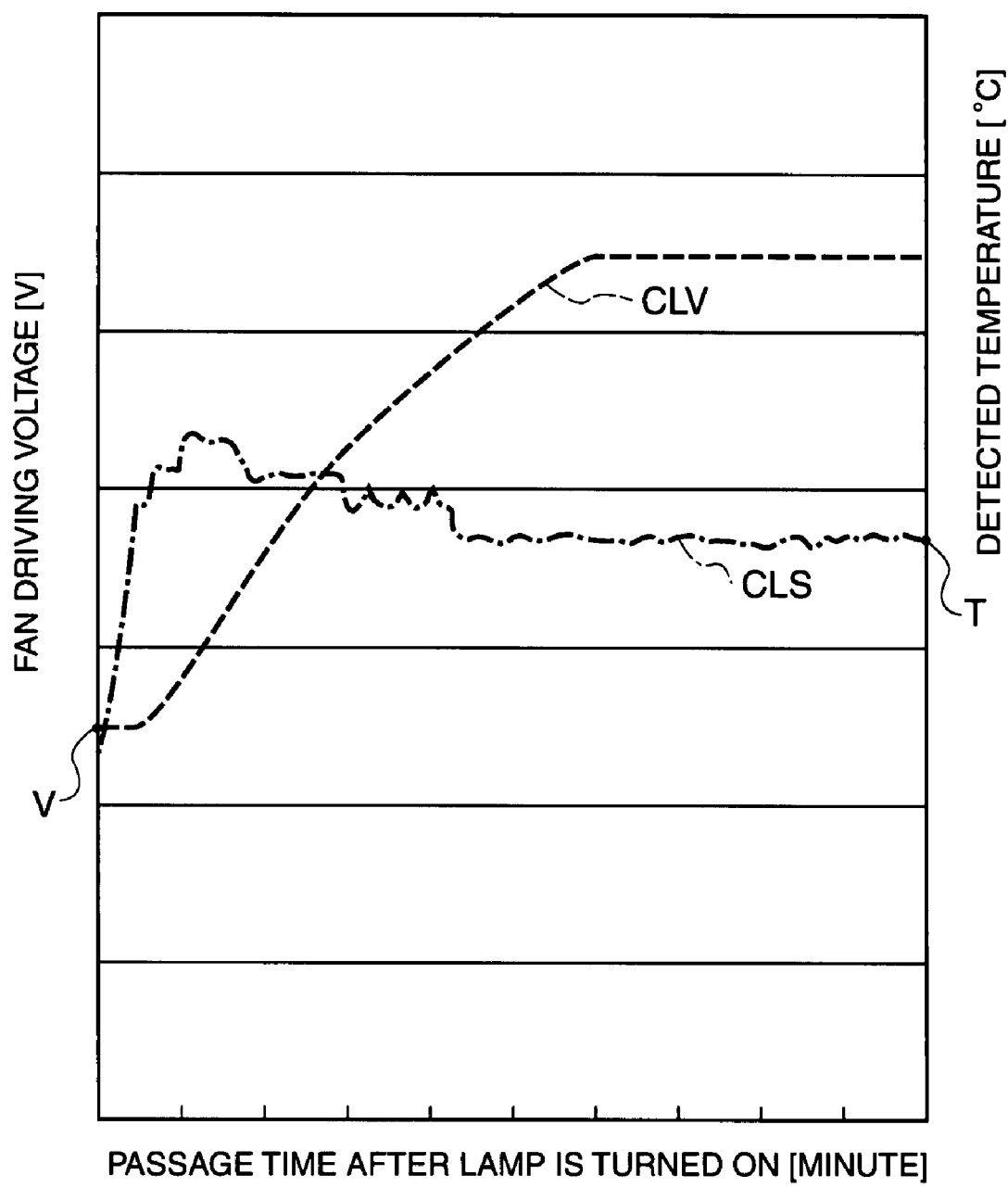
FIG. 12 is a diagram schematically illustrating a feedback control state according to the embodiment.

FIG. 12 is a diagram schematically illustrating a state of feedback control. In FIG. 12, a horizontal axis indicates a passage time after the light source lamp 416 is turned on (after the projector 1 starts), and a longitudinal axis indicates the detection temperature of the thermistor 88 and the voltage applied to the cooling fans 614 and 615. In FIG. 12, a curved line CLS indicates a behavior of the detection temperature of the thermistor 88, and a curved line CLV indicates a behavior of a voltage applied to the cooling fans 614 and 615.

As shown in FIG. 12, the fan driving control unit 85 changes a voltage applied to the cooling fans 614 and 615 according to the detection temperature of the thermistor 88, and performs feedback control such that the temperature in the vicinity of the electro-optical device 44 is stabilized in the set temperature T as the time after the light source lamp 416 is turned on passes.

Meanwhile, when the usage environmental temperature of the projector 1 is high, the temperature of the air blown to the electro-optical device 44 is high. Accordingly, an increasing rate of the temperature in the vicinity of the electro-optical device 44 becomes higher. Further, even when the filter 611 causes the clogging, that is, even when the dusts are attached to the filter 611 and a predetermined amount of air cannot be introduced in the filter 611, the increasing rate of the temperature in the vicinity of the electro-optical device 44 becomes higher. In the above-described case, when the fan driving control unit 85 performs the feedback control, after the cooling fans 614 and 615 are driven with the initial voltage value V, the increasing rate of the voltage value is relatively increased, and the cooling fans 614 and 615 are driven with the set upper limit (upper limit of the voltage used in the cooling fans 614 and 615).

In addition, as described below, the clogging detection control unit 86 discriminates the respective cases described above by performing the clogging detection control, and detects whether the filter 611 causes the clogging.

That is, when the feedback control is performed by the fan driving control unit 85 in Step S2, the clogging detection control unit 86 always monitors whether the voltage applied from the fan driving control unit 85 to the cooling fans 614 and 615 reaches an upper limit (Step S3).

In Step S3, when it is determined as a 'Y', that is, when it is determined that the voltage applied to the cooling fans 614 and 615 reaches the upper limit, the clogging detection control unit 86 receives the signal output from the wind velocity sensor 72, and recognizes the wind velocity value measured by the wind velocity sensor 72 (Step S4).

After Step S4, the clogging detection control unit 86 compares the recognized wind velocity value, and the set wind velocity value based on the set wind velocity information stored in the memory 87, and determines whether the wind velocity value is less than the set wind velocity value, that is, the filter 611 needs to be exchanged (Step S5).

In Step S5, when it is determined as a 'N' by the clogging detection control unit 86, that is, when it is determined that the wind velocity value is not less than the set wind velocity value, the control device 8 returns to Step S2, and continuously performs the feedback control. That is, when the wind velocity value is not less than the set wind velocity value, it does not correspond to the case where the filter 611 causes the clogging. For example, it corresponds to the case where the usage environmental temperature of the projector 1 is high. The clogging detection control unit 86 does not recognize the above-described case as the case where the filter 611 causes the clogging.

Meanwhile, in Step S5, when it is determined as a 'Y', that is, when it is determined that the wind velocity value is less than the set wind velocity value, the clogging detection control unit 86 recognizes the current state as the state where the filter 611 causes the clogging (Step S6).

After Step S6, the clogging detection control unit 86 outputs the predetermined control signal to the liquid crystal panel driving control unit 82, forms information (optical image) urging the exchange of the filter 611 in the liquid crystal panel 441, for example, an optical image including a message indicating 'please change a filter', and displays the information on the screen (Step S7).

According to the above-described embodiment, the following effects can be obtained.

In this embodiment, the wind velocity measuring device 7 includes an air circulating unit 71 where the barrier portions 711 and 712 and the exhaust port 713 are formed. As a result, after the air that propagates toward the air circulating unit 71 collides with the barrier portions 711 and 712, the air flows into the space Ar2. For this reason, in a state where the pressure of the space Ar1 is lower than the pressure of the barrier portions 711 and 712, the air can flow into the space Ar2. Further, by the exhaust port 713, the flow rate of the air circulating in the space Ar2 can be increased. Accordingly, the space Ar2 becomes a pressure state where the pressure of the space Ar2 is sufficiently lower than the pressure of the space Ar1, and the air can be circulated with a predetermined wind velocity. In addition, since wind velocity sensor 72 measures the wind velocity of the air in the space Ar2, in terms of the sensor characteristic, the wind velocity can be measured in an optimal pressure state, and the wind velocity of the air blown to the electro-optical device 44 can be measured with high precision without causing the variation in the measured wind velocity value.

In this case, the wind velocity measuring device 7 is formed such that the air circulating unit 71 communicates the second duct 616. That is, the wind velocity measuring device 7 is disposed on the front stage side of the flow passage of the air with respect to the electro-optical device 44. In this way, for example, as compared with the structure where the wind velocity measuring device 7 measures the wind velocity of the air after passing through the electro-optical device 44, the variation can be further suppressed from occurring in the measured wind velocity value, and can measure the wind velocity of the air blown to the electro-optical device 44 with high precision. Further, when the pressure of the space Ar1 in the second duct 616 becomes an inner pressure relatively higher than the pressure of the air blown from the cooling fan 614, the barrier portions 711 and 712 can sufficiently lower the inner pressure of the space Ar2 of the air circulating unit 71. For example, the pressure of the space Ar2 can be made in the same pressure state as the arrange location of the electro-optical device 44, and the wind velocity of the air blown to the electro-optical device 44 can be measured with high precision.

Further, in the air circulating unit 71, the two barrier portions 711 and 712 are formed, and one barrier portion 711 is erected from the lower side to the upper side, and the other barrier portion 712 is erected from the upper side to the lower side. In this way, for example, as compared with the structure where only one barrier portion is formed, it is possible to uniform the wind velocity of the air flowing into the space Ar2 through the two barrier portions 711 and 712 over the entire region. For this reason, it is possible to suppress the variation from occurring in the wind velocity value measured by the wind velocity sensor 72, and the wind velocity of the air blown to the electro-optical device 44 can be measured with high precision.

Furthermore, since the air circulating unit 71 is composed of a pair of circulating members 71A and 71B formed to be divided into two bodies, the two barrier portions 711 and 712 or the exhaust port 713 can be easily formed, that is, the air circulating unit 71 can be easily manufactured.

Further, since the control device 8 includes the fan driving control unit 85, the set wind velocity information storage unit 873, and the clogging detection control unit 86, the clogging of the filter 611 can be detected with high precision on the basis of the voltage applied to the cooling fan 614, the high precision wind velocity value measured by the wind velocity measuring device 7, and the set wind velocity value according to the set wind velocity information stored in the set wind velocity information storage unit 873. As a result, the exchange of the filter 611 can be properly recognized to the user.

Although the preferred embodiment of the invention has been described, the invention is not limited thereto. Various changes and modifications can be made without departing from the spirit and scope of the invention.

The arrangement location of the wind velocity measuring device 7 is not limited to the location defined to the location described in the above-described embodiment. In regards to the location where the wind velocity measuring device is arranged, the wind velocity measuring device may be disposed at the location where the wind velocity of the air blown to the cooled object can be measured. For example, in the above-described embodiment, the wind velocity measuring device 7 is disposed at the location (first wind guiding portion 6161) where the wind velocity measuring device 7 can measure the wind velocity of the air blown to the liquid crystal panels 441R and 441B. However, the wind velocity measuring device 7 may be disposed at the location where the wind velocity of the air having passed through the liquid crystal panels 441R and 441B can be measured. Alternatively, the wind velocity measuring device 7 may be disposed at the location where the wind velocity measuring device can measure the wind velocity of the air blown to the other cooled objects, that is, the liquid crystal panel 441G, the polarization converting element 414, the power supply unit 5, the light source lamp 416, and the like.

The structure of the air circulating unit 71 is not limited to the structure that has been described in the above-described embodiment. For example, in the above-described embodiment, as for the barrier portions, the two barrier portions 711 and 712 are constructed. However, only one barrier portion may be provided, or three or more barrier portions may be provided. That is, the barrier portion and the exhaust port serve to make the inner pressure of the space Ar2 become an optical pressure, in terms of the sensor characteristic of the wind velocity sensor 72. The shape or the number thereof is not limited.

The structure of the wind velocity sensor 72 is not limited to the structure that has been described in the above-described embodiment, but a wind velocity sensor having another structure may be used. For example, the wind velocity sensor may include a heater, an ambient temperature sensor, and a control device that controls the heat and the ambient temperature sensor, and the control device controls the temperature of the heater such that the temperature of the heater always maintains the predetermined temperature difference with respect to the ambient temperature having been detected by the ambient temperature sensor. In addition, when the temperature difference deviates from the predetermined value due to the air blown to the cooled objects, the control device controls the heater such that the temperature difference becomes the predetermined value. At this time, since the heat radiated from the heater is associated with the wind velocity of the blown air, the wind velocity of the air is measured from the power that is applied to the heater to radiate the heat.

In the above-described embodiment, the fan driving control unit 85 performs the feedback control when the fan driving control unit 85 controls the driving of the cooling fans 614 and 615, but the invention is not limited thereto. The fan driving control unit 85 may perform other driving control, for example, temperature correspondence control to be described below.

For example, fan control information that is stored in the fan control information storage unit 871 is composed of voltage and temperature association information in which temperature information related to the temperature is associated with voltage value information related to a voltage for driving the cooled fans 614 and 615 with the rotational number according to the temperature. In addition, the fan driving control unit 85 sequentially recognizes the detection temperature that is detected by the thermistor 88, and performs the temperature correspondence control that allows the cooled fans 614 and 615 with the voltage according to the detection temperature on the basis of the recognized detection temperature and the voltage and temperature association information.

In the above-described embodiment, the control device 8 performs the clogging detection control on the basis of the wind velocity value measured by the wind velocity measuring device 7, but the invention is not limited thereto. The control device may perform other control, for example, control for making the optical source lamp 416 turned off, control for making the power supply turned off, and control for making warning display for abnormal heat emission performed. According to this structure, the optical component, such as the liquid crystal panel 441, can be prevented from being overheated due to the irradiation of the light beam and damaged.

In the above-described embodiment, after detecting the clogging of the filter 611, the clogging detection control unit 86 outputs a predetermined control signal to the liquid crystal panel driving control unit 82, and forms on the liquid crystal panel 441, an optical image indicating that the exchange of the filter 611 is needed, but the invention is not limited thereto. For example, the clogging detection control unit 86 may transmit the message urging the exchange of the filter 611 to the sound output unit through the sound, or may make a light-emitting element, such as an LED (light emitting diode), emit light. That is, after detecting the clogging of the filter 611, the clogging detection control unit 86 may notify the notifying units (liquid crystal driving control unit 82, sound output unit, light emitting element, or the like) of information urging the exchange of the filter.

In the above-described embodiment, the light source device 411 is composed of a discharge emission-type light source device, but the invention is not limited thereto. Various solid light-emitting elements, such as a laser diode, an LED, an organic EL (electro luminescence) element, a silicon light emitting element, or the like, may be used.

Further, in the above-described embodiment, only one light source device 411 is used, and light is separated into three color light components by means of the color separation optical device 42. However, the color separation optical device 42 is omitted, and the three solid light-emitting elements that emit the three color light components may be constructed as the light source devices.

In the above-described embodiment, the cross dichroic prism 445 is used as the color synthesis optical device, but the invention is not limited thereto. A plurality of dichroic mirrors are provided to synthesize the individual color light components.

In the above-described embodiment, the projector 1 includes the three liquid crystal panels 441R, 441G, and 441B, but the invention is not limited thereto. That is, the liquid crystal panel, which uses liquid crystal panels of not more than the two, or four or more liquid crystal panels, may be applied to the invention.

Further, in the above-described embodiment, the transmissive liquid crystal panel 441 is used in which a light beam incident surface and a light beam emission surface are different from each other. However, a reflective liquid crystal panel may be used in which the light beam incident surface and the light beam emission surface are the same.

In the above-described embodiment, the projector 1 is exemplified which includes the liquid crystal panel 441 as the light modulating device. However, if a light modulating device modulates the incident light beam according to image information and forms an optical image, it is possible to use a light modulating device having another structure. For example, the invention may be applied to a projector that uses other than a liquid crystal layer, such as a device using a micro mirror.

In the above-described embodiment, only the front-type projector 1 is exemplified where the image projection is performed from a screen viewing direction. However, the invention may be applied to a rear-type projector that performs image projection from a direction opposite to the screen viewing direction.

In the above-described embodiment, the wind velocity measuring device according to the aspect of the invention is mounted on the projector, but the invention is not limited thereto. The wind velocity measuring device may be mounted on other electronic apparatus, such as a personal computer, which includes a cooled object, a cooling fan, and an exterior casing.

The optimal structure that embodies the aspect of the invention is disclosed in the above description, but the invention is not limited thereto. That is, the invention has been described in detail preferred embodiments thereof with reference to the attached drawings. It will be apparent to those skilled in the art that various modifications and changes may be made in the shape, the material, the number, and the other structure in the above-described embodiment without departing from the scope and spirit of the invention.

Accordingly, it should be understood that the shape and material disclosed in the above embodiments are not limitative, but illustrative in all aspects. The scope of the present invention is defined by the appended claims rather than by the description preceding them, and all changes and modifications that fall within meets and bounds of the claims, or equivalences of such meets and bounds are therefore intended to be embraced by the claims.

The wind velocity measuring device according to the embodiment of the invention can measure the wind velocity of the air blown to the cooled object with high precision. Therefore, the wind velocity measuring device can be used in a projector for presentation or a home theater.

The entire disclosure of Japanese Patent Application No. 2006-135095, filed May 15, 2006 is expressly incorporated by reference herein.

What is claimed is:

1. A wind velocity measuring device for inclusion in an electronic apparatus including cooled objects and cooling fans for cooling the cooled objects and measuring a wind velocity of air blown to the cooled objects, the wind velocity measuring device comprising:
   a wind velocity measuring unit that measures a wind velocity of air; and
   an air circulating unit that circulates a portion of the air blown to the cooled objects,
   wherein the air circulating unit includes a wind velocity measurement channel that receives inner air at a front stage side of the circulation direction of the air previous to cooling the cooled objects, and barrier portions that extend to cross the wind velocity measurement channel and an exhaust port that discharges the inner air provided by the wind velocity measurement channel to the outside, and
   the wind velocity measuring unit measures a wind velocity of the air within the wind velocity measurement channel between the barrier portions and the exhaust port of the air circulating unit.

2. An electronic apparatus comprising:
   cooled objects;
   cooling fans for cooling the cooled objects;
   an exterior casing that accommodates the cooled objects and the cooling fans therein;
   the wind velocity measuring device according to claim 1;
   a temperature detecting unit that detects an internal temperature of the exterior casing; and
   a control device that controls driving of constituent members of the electronic apparatus,
   wherein the exterior casing having formed therein a suction port that introduces an external air to an inside of the exterior casing when the cooling fans are driven, the suction port being constructed so that a filter for preventing a foreign material infiltrating from the outside of the exterior casing may be freely removed,
   and wherein the control device includes
   a fan driving control unit that changes a voltage applied to the cooling fans so as to control driving of the cooling fans, on the basis of the temperature detected by the temperature detecting unit,
   a set wind velocity information storage unit that stores set wind velocity information for a set wind velocity value at which the filter needs to be exchanged, and
   a clogging detection control unit for clogging detection control that compares a wind velocity value measured by the wind velocity measuring device when the fan driving control unit applies a predetermined voltage to the cooling fan and the set wind velocity value based on the set wind velocity information, and determines whether the filter needs to be exchanged according to the compared result.

3. The electronic apparatus according to claim 2, further comprising ducts that guide air blown from the cooling fans to the cooled objects,
   wherein the wind velocity measuring device is disposed such that the air circulating unit communicates with inner portions of the ducts.

4. The electronic apparatus according to claim 2,
   wherein the electronic apparatus is a projector that includes a light source device, a light modulating device modulating a light beam emitted from the light source device according to image information so as to form an optical image, and a projection optical device that projects the optical image to be enlarged.

5. The electronic apparatus according to claim 3,
   wherein the electronic apparatus is a projector that includes a light source device, a light modulating device modulating a light beam emitted from the light source device according to image information so as to form an optical image, and a projection optical device that projects the optical image to be enlarged.

* * * * *